US012609152B2

(12) United States Patent
Xu et al.

(10) Patent No.: US 12,609,152 B2
(45) Date of Patent: Apr. 21, 2026

(54) DDR PHY CRITICAL CLOCK SWITCHING AND GATING ARCHITECTURE

(71) Applicant: QUALCOMM Incorporated, San Diego, CA (US)

(72) Inventors: Yong Xu, San Diego, CA (US); Boris Dimitrov Andreev, San Diego, CA (US); Yuxin Li, San Diego, CA (US); Vikas Mahendiyan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 461 days.

(21) Appl. No.: 17/988,186

(22) Filed: Nov. 16, 2022

(65) Prior Publication Data

US 2024/0161808 A1    May 16, 2024

(51) Int. Cl.
*G11C 11/4076* (2006.01)
*H03K 19/20* (2006.01)
*H03L 7/081* (2006.01)

(52) U.S. Cl.
CPC .......... *G11C 11/4076* (2013.01); *H03K 19/20* (2013.01); *H03L 7/0812* (2013.01)

(58) Field of Classification Search
CPC .... G11C 11/4076; H03K 19/20; H03L 7/0812
USPC ...................................................... 365/233.13
See application file for complete search history.

(56) References Cited

U.S. PATENT DOCUMENTS 6,636,980 B1    10/2003  Gervais et al.
7,123,524 B1    10/2006  Han

| | | | |
|---|---|---|---|
| 7,474,716 B2 | 1/2009 | Vallet et al. | |
| 7,500,165 B2 | 3/2009 | Guettaf | |
| 8,975,921 B1 * | 3/2015 | Sangolli | H03K 19/08 |
| | | | 326/46 |
| 9,154,142 B2 * | 10/2015 | Dobbs | G06F 11/1604 |
| 10,401,941 B2 | 9/2019 | Pant et al. | |
| 10,530,370 B1 * | 1/2020 | Mohan | H03K 5/135 |
| 11,152,943 B1 * | 10/2021 | Bowles | H03K 21/026 |
| 11,803,207 B1 * | 10/2023 | Mathur | G06F 1/06 |
| 2015/0146477 A1 | 5/2015 | Iijima et al. | |
| 2021/0382519 A1 * | 12/2021 | Chang | G06F 1/12 |
| 2023/0051554 A1 * | 2/2023 | Arora | H03K 19/20 |
| 2023/0421144 A1 * | 12/2023 | Lin | G06F 1/08 |

FOREIGN PATENT DOCUMENTS

CN          115242224 A      10/2022

OTHER PUBLICATIONS

International Search Report and Written Opinion—PCT/US2023/076499—ISA/EPO—Feb. 6, 2024.

* cited by examiner

*Primary Examiner* — Sung Il Cho

(74) *Attorney, Agent, or Firm* — Loza & Loza, LLP

(57) ABSTRACT

In certain aspects, a system includes a first clock source configured to generate a first clock signal, a second clock source configured to generate a second clock signal, a clock path, and an OR gate having a first input, a second input, and an output, wherein the output of the OR gate is coupled to the clock path. The system also includes a first clock gating circuit coupled between the first clock source and the first input of the OR gate, and a second clock gating circuit coupled between the second clock source and the second input of the OR gate.

18 Claims, 10 Drawing Sheets

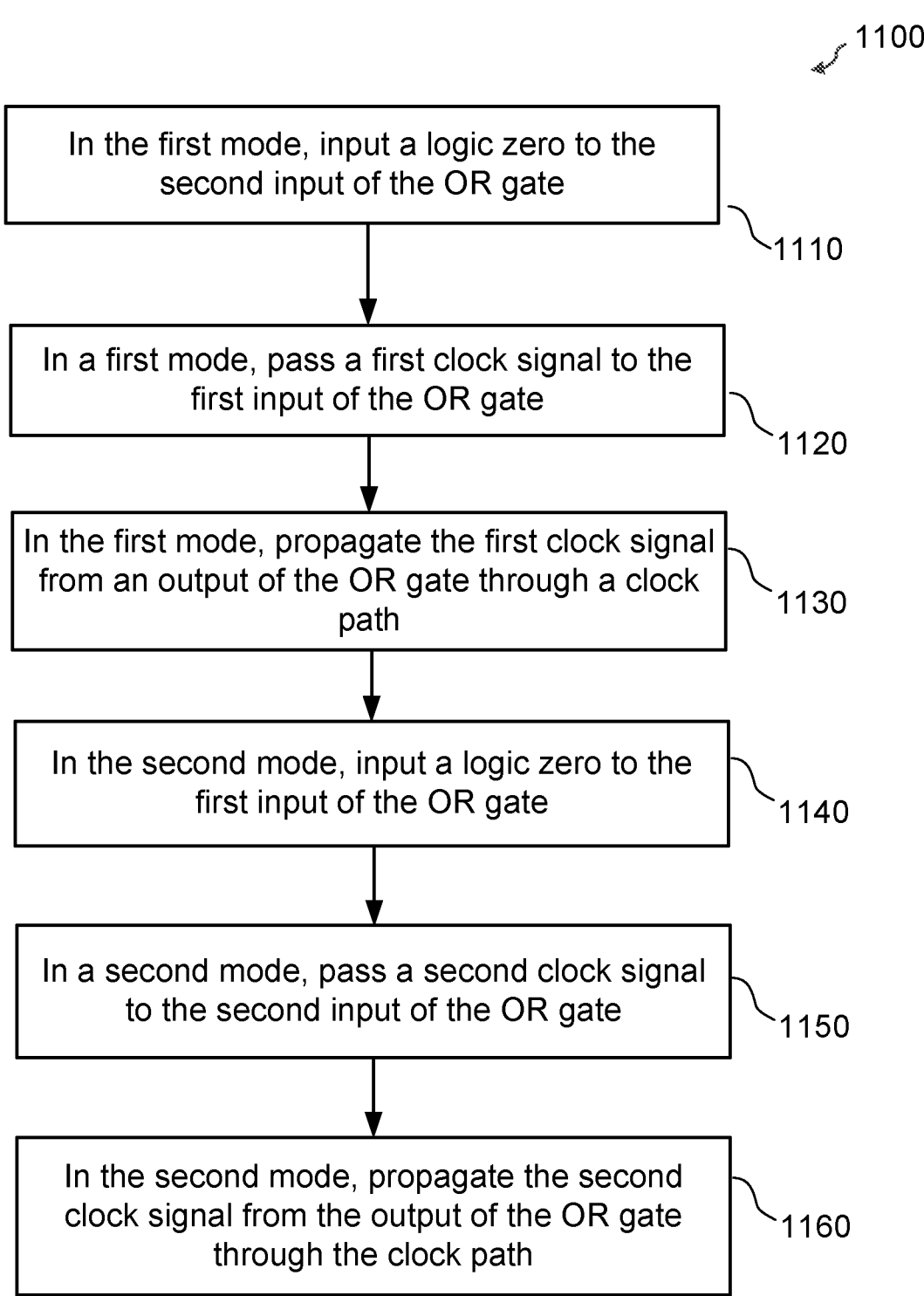

1100

In the first mode, input a logic zero to the
second input of the OR gate
1110

In a first mode, pass a first clock signal to the
first input of the OR gate
1120

In the first mode, propagate the first clock signal
from an output of the OR gate through a clock
path
1130

In the second mode, input a logic zero to the
first input of the OR gate
1140

In a second mode, pass a second clock signal
to the second input of the OR gate
1150

In the second mode, propagate the second
clock signal from the output of the OR gate
through the clock path
1160

FIG. 11

DDR PHY CRITICAL CLOCK SWITCHING AND GATING ARCHITECTURE

BACKGROUND

Field

Aspects of the present disclosure relate generally to clocks, and, more particularly, to clock switching.

Background

A system may include a clock source (e.g., a phase-locked loop) configured to generate a clock signal for timing operations of one or more circuits in the system. The system may also include a clock path for distributing the clock signal from the clock source to the one or more circuits. The clock path may include a clock gating circuit for passing the clock signal to the one or more circuits when the one or more circuits are active and for gating the clock signal when the one or more circuits are idle (i.e., not active) to conserve power. The system may also include a multiplexer coupled to the clock path for switching the clock path between multiple clock sources.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a first clock source configured to generate a first clock signal, a second clock source configured to generate a second clock signal, a clock path, and an OR gate having a first input, a second input, and an output, wherein the output of the OR gate is coupled to the clock path. The system also includes a first clock gating circuit coupled between the first clock source and the first input of the OR gate, and a second clock gating circuit coupled between the second clock source and the second input of the OR gate.

A second aspect relates to a system. The system includes a first OR gate having a first input, a second input, and an output, a first clock gating circuit coupled to the first input of the first OR gate, and a second clock gating circuit coupled to the second input of the OR gate. The system also includes a second OR gate having a first input, a second input, and an output, a third clock gating circuit coupled to the first input of the second OR gate, and a fourth clock gating circuit coupled to the second input of the second OR gate. The system further includes a multiplexer having a first input, a second input, and an output, a first clock path coupled between the output of the first OR gate and the first input of the multiplexer, and a second clock path coupled between the output of the second OR gate and the second input of the multiplexer.

A third aspect relates to a method for clock switching using an OR gate having a first input and a second input. The method includes, in a first mode, inputting a logic zero to the second input of the OR gate, passing a first clock signal to the first input of the OR gate, and propagating the first clock signal from an output of the OR gate through a clock path. The method also includes, in a second mode, inputting a logic zero to the first input of the OR gate, passing a second clock signal to the second input of the OR gate, and propagating the second clock signal from the output of the OR gate through the clock path.

BRIEF DESCRIPTION OF THE DRAWINGS

FIG. 11 is a flowchart illustrating a method for clock switching according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figures 1, 2:
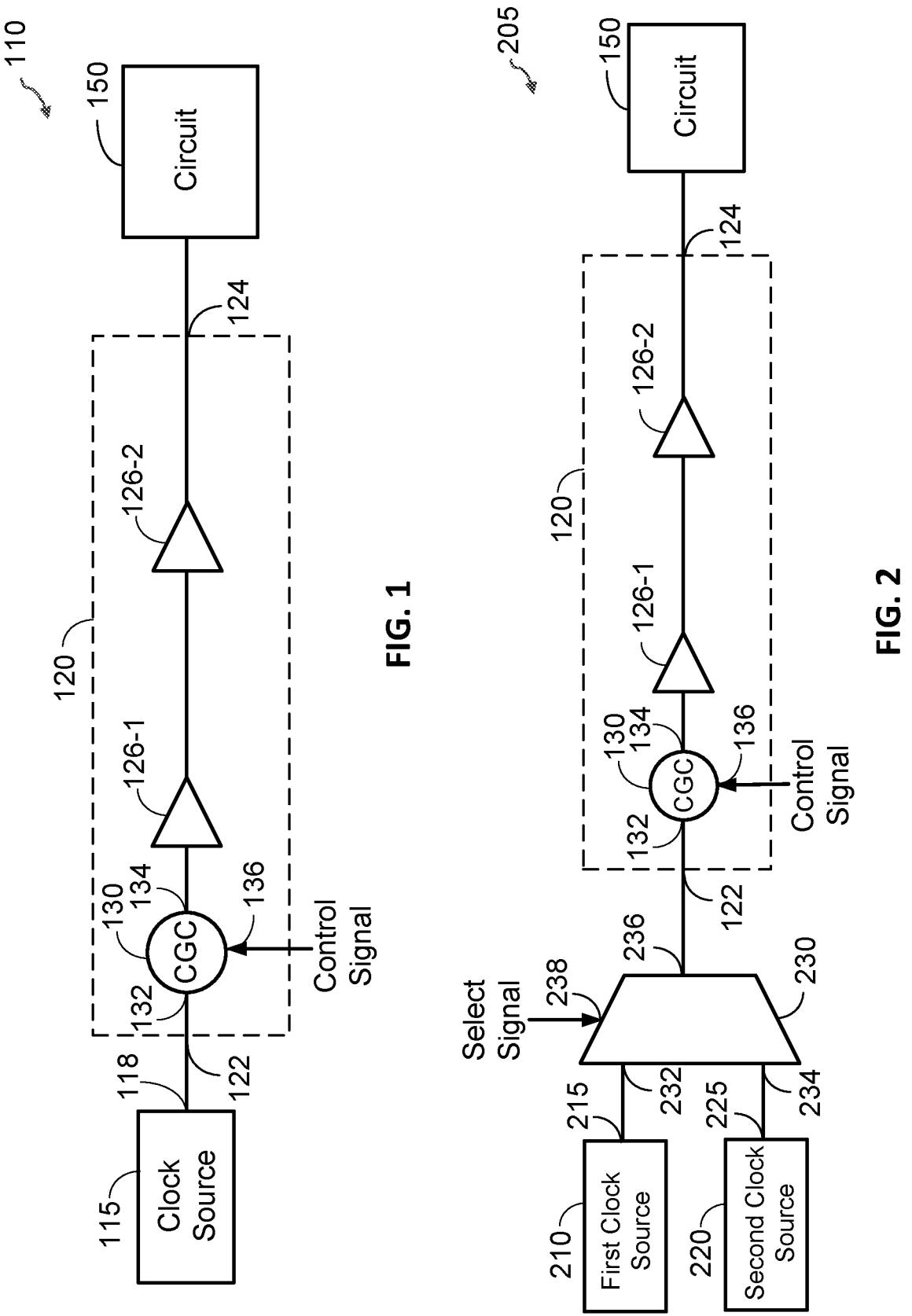
FIG. 1 shows an example of a system including a clock path according to certain aspects of the present disclosure.
FIG. 2 shows an example of a system including a multiplexer for switching a clock path between multiple clock sources according to certain aspects of the present disclosure.

FIG. 1 shows an example of a system 110 including a clock source 115, a clock path 120, and a circuit 150 according to certain aspects. The circuit 150 may include sequential logic, one or more transmitters, a processor, a memory, etc. The clock source 115 is configured to generate a clock signal and output the clock signal at an output 118 of the clock source 115. The clock source 115 may be implemented with a phase-locked loop (PLL) or another type of clock source.

The clock path 120 has an input 122 coupled to the output 118 of the clock source 115 and an output 124 coupled to the circuit 150. The clock path 120 is configured to receive the clock signal at the input 122 and distribute the clock signal to the circuit 150. The clock signal is used for timing operations of the circuit 150. As used herein, a "clock signal" may be a periodic signal that oscillates between high and low. As used herein, a "clock path" may include one or more components (e.g., clock buffers) through which a clock signal propagates.

In the example shown in FIG. 1, the clock path 120 includes clock buffers 126-1 and 126-2 and a clock gating circuit 130. Each of the clock buffers 126-1 and 126-2 is configured to drive the clock signal through the clock path 120 (e.g., to enable the clock signal to propagate longer distances and/or drive larger loads). Each of the clock buffers 126-1 and 126-2 may be implemented with one or more inverters (e.g., complementary inverters) or another type of clock buffer. It is to be appreciated that the clock path 120 may include a different number of clock buffers than shown in the example in FIG. 1. The number of clock buffers 126-1 and 126-2 in the clock path 120 may depend on, for example, the length of the clock path 120, the drive strengths of the clock buffers 126-1 and 126-2, the load of the circuit 150, etc.

The clock gating circuit 130 has an input 132 and an output 134. In the example shown in FIG. 1, the input 132 is coupled to the clock source 115 and the output 134 is coupled to clock buffer 126-1. However, it is to be appreciated that the present disclosure is not limited to this example.

The clock gating circuit 130 is configured to receive a control signal at a control input 136 from a control circuit (not shown), and pass the clock signal or gate (i.e., block) the clock signal based on the control signal. For example, the clock gating circuit 130 may be configured to pass the clock signal when the control signal has a first logic value, and gate the clock signal when the control signal has a second logic value. The first logic value may be logic one and the second logic value may be logic zero, or vice versa. However, it is to be appreciated that the control signal is not limited to this example.

In certain aspects, the control circuit (not shown) may cause the clock gating circuit 130 to pass the clock signal (e.g., by setting the control signal to the first logic value) when the circuit 150 is active, and cause the clock gating circuit 130 to gate the clock signal (i.e., by setting the control signal to the second logic value) when the circuit 150 is in an idle mode (i.e., not active) to save power. When the clock gating circuit 130 gates the clock signal, the clock gating circuit 130 may output a static logic value (e.g., one or zero) at the output 134. The static logic value may eliminate or significantly reduce dynamic power consumption in the circuit 150 and the components (e.g., clock buffers 126-1 and 126-2) located downstream of the clock gating circuit 130.

Although one clock gating circuit 130 is shown in the example in FIG. 1, it is to be appreciated that the clock path 120 may include two or more clock gating circuits (e.g., at different locations along the clock path 120). It is also to be appreciated that the clock path 120 may include multiple branches (not shown) forming a clock tree (i.e., clock distribution network) to distribute the clock signal to one or more other circuits (not shown) in addition to the circuit 150 shown in FIG. 1. It is also to be appreciated that the clock path 120 may include one or more additional components not shown in FIG. 1.

FIG. 2 shows an example of a system 205 including the clock path 120, the circuit 150, a first clock source 210, a second clock source 220, and a multiplexer 230. As discussed further below, the multiplexer 230 is used for switching the clock path 120 between the first clock source 210 and the second clock source 220.

In this example, the multiplexer 230 has a first input 232, a second input 234, a select input 238, and an output 236 coupled to the input 122 of the clock path 120. The first clock source 210 has an output 215 coupled to the first input 232 of the multiplexer 230, and the second clock source 220 has an output 225 coupled to the second input 234 of the multiplexer 230. The first clock source 210 is configured to generate a first clock signal and output the first clock signal at the output 215. The second clock source 220 is configured to generate a second clock signal and output the second clock signal at the output 225. Each of the clock sources 210 and 220 may be implemented with a respective PLL or another type of clock source. In certain aspects, the first clock signal has a first clock frequency and the second clock signal has a second clock frequency, in which the first clock frequency is different from the second clock frequency. This allows the multiplexer 230 to switch the circuit 150 between the first clock frequency and the second clock frequency by switching the clock path 120 between the first clock source 210 and the second clock source 220, as discussed further below.

In certain aspects, the multiplexer 230 is configured to receive a select signal at the select input 238, select one of the first input 232 and the second input 234 based on the select signal, and couple the selected one of the first input 232 and the second input 234 to the output 236. Thus, the multiplexer 230 passes the first clock signal to the clock path 120 when the first input 232 is selected, and passes the second clock signal to the clock path 120 when the second input 234 is selected. In certain aspects, the multiplexer 230 may select the first input 232 when the select signal has a first logic value, and select the second input 234 when the select signal has a second logic value. The first logic value may be logic one and the second logic value may be logic zero, or vice versa. However, it is to be appreciated that the select signal is not limited to this example.

In certain aspects, the select signal is controlled by the control circuit (not shown). In these aspects, the control circuit may cause the multiplexer 230 to select the first input 232 (e.g., by setting the select signal to the first logic value) to operate the circuit 150 at the first clock frequency, and cause the multiplexer 230 to select the second input 234 (e.g., by setting the select signal to the second logic value) to operate the circuit 150 at the second clock frequency. The control circuit may select the first clock signal or the second clock signal based on, for example, a performance mode of the circuit 150, a data rate of the circuit 150, and/or another parameter.

In this example, the multiplexer 230 provides the system 205 with clock switching functionality and the clock gating circuit 130 provides the system 205 with clock gating functionality. A challenge with the system 205 is that clock switching and clock gating can generate glitches in the system 205, which can propagate to the circuit 150 via the clock path 120 and cause timing issues (e.g., timing violations) in the circuit 150. As used herein, a glitch may be a narrow pulse that does not meet timing requirements of the circuit 150. For the example where the circuit 150 includes sequential logic (e.g., flip-flops), the glitches may cause setup time and/or hold time violations in the sequential logic.

To prevent glitches during clock gating, the clock gating circuit 130 may be implemented with a glitch-free clock gating circuit. An example of a glitch-free clock gating circuit is discussed below with reference to FIG. 8.

Glitches may also be generated during clock switching. For example, a glitch may be generated when the multiplexer 230 switches from the first clock signal to the second clock signal right after a rising edge of a pulse of the first clock signal. In this case, the clock switching may cut off most of the pulse of the first clock signal, resulting in a glitch (i.e., narrow pulse).

To address glitches caused by clock switching, the multiplexer 230 may be implemented with a glitch-free multiplexer to prevent the generation of glitches during clock switching. However, a challenge with using a glitch-free multiplexer is that the glitch-free multiplexer may include a relatively large number of components, which increases the number of components through which the selected one of the first clock signal and the second clock signal needs to propagate. The larger number of components reduces clock quality (e.g., reduces jitter performance). Accordingly, it is desirable to reduce the number of components through which a clock signal propagates to improve clock quality (e.g., improve jitter performance) while maintaining clock switching functionality and clock gating functionality.

Figure 3:
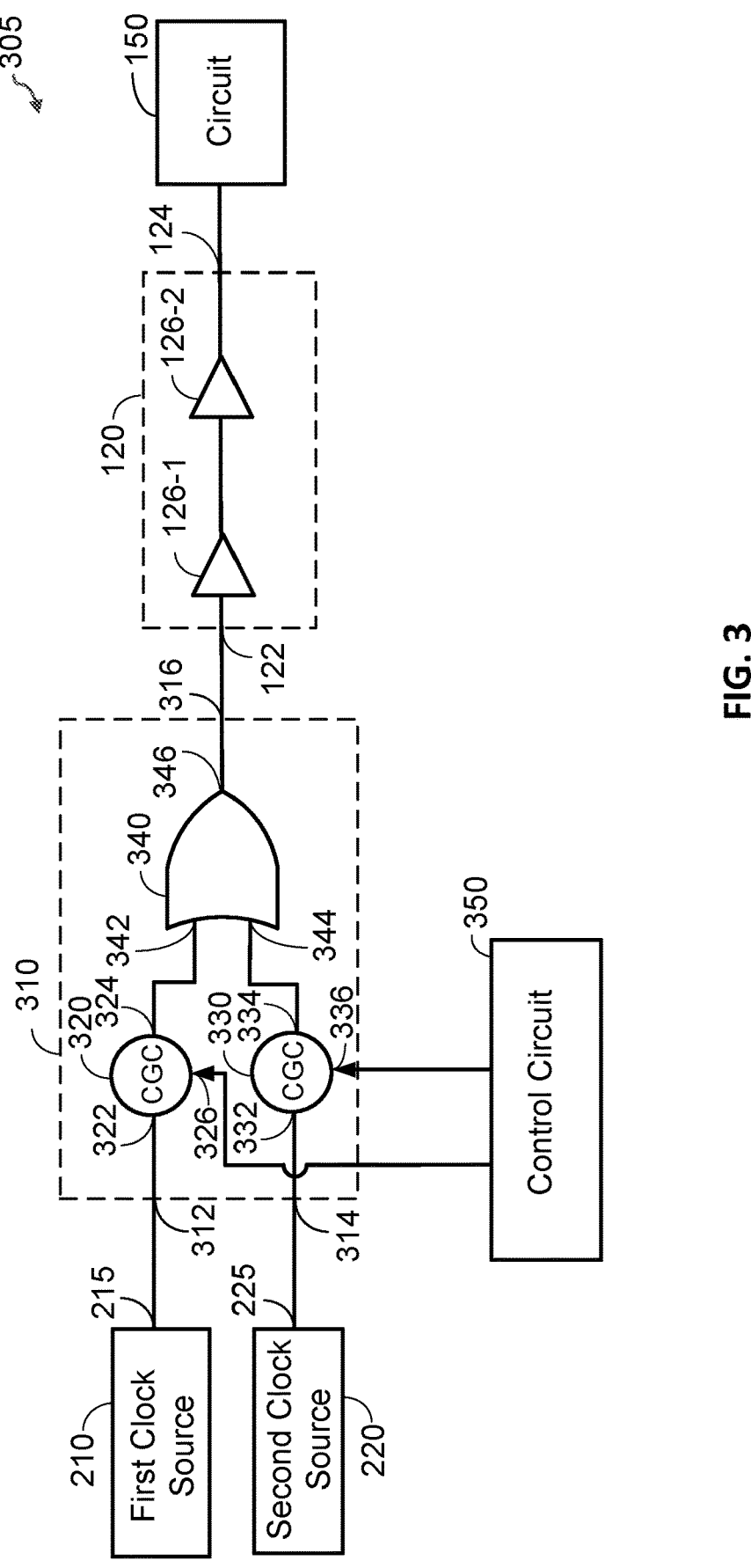
FIG. 3 shows an example of a circuit with clock switching functionality and clock gating functionality according to certain aspects of the present disclosure.

FIG. 3 shows an example of a system 305 including a circuit 310 that reduces the number of components through which a clock signal propagates compared to the system 205 in FIG. 2 while maintaining clock switching functionality and clock gating functionality, as discussed further below.

The circuit 310 has a first input 312 coupled to the output 215 of the first clock source 210, a second input 314 coupled to the output 225 of the second clock source 220, and an output 316 coupled to the input 122 of the clock path 120. The circuit 310 replaces the multiplexer 230 and the clock gating circuit 130 shown in FIG. 2.

In this example, the circuit 310 includes a first clock gating circuit 320, a second clock gating circuit 330, and an OR gate 340. The OR gate 340 has a first input 342, a second input 344, and an output 346. In this disclosure, it is to be understood that an OR gate may be implemented with one logic gate or a combination of two or more logic gates (e.g., one or more NAND gates, one or more NOR gates, one or more inverters, or any combination thereof) that are arranged to perform an OR operation.

The first clock gating circuit 320 is coupled between the first input 312 of the circuit 310 and the first input 342 of the OR gate 340, the second clock gating circuit 330 is coupled between the second input 314 of the circuit 310 and the second input 344 of the OR gate 340, and the output 346 of the OR gate 340 is coupled to the output 316 of the circuit 310. In the example in FIG. 3, the first clock gating circuit 320 has an input 322 coupled to the first input 312 of the circuit 310, and an output 324 coupled to the first input 342 of the OR gate 340. The second clock gating circuit 330 has an input 332 coupled to the second input 314 of the circuit 310 and an output 334 coupled to the second input 344 of the OR gate 340.

In certain aspects, the system 305 includes a control circuit 350 coupled to the first clock gating circuit 320 and the second clock gating circuit 330. The control circuit 350 is configured to generate a first control signal and output the first control signal to a control input 326 of the first clock gating circuit 320 to control the gating function of the first clock gating circuit 320, as discussed further below. The control circuit 350 is also configured to generate a second control signal and output the second control signal to a control input 336 of the second clock gating circuit 330 to control the gating function of the second clock gating circuit 330, as discussed further below.

The first clock gating circuit 320 is configured to receive the first control signal from the control circuit 350 via the control input 326, and pass or gate (i.e., block) the first clock signal based on the first control signal. For example, the first clock gating circuit 320 may be configured to pass the first clock signal when the first control signal has a first logic value, and gate the first clock signal when the first control signal has a second logic value. The first logic value may be logic one and the second logic value may be logic zero, or vice versa. Thus, in this example, the control circuit 350 may cause the first clock gating circuit 320 to pass the first clock signal by setting the first control signal to the first logic value, and cause the first clock gating circuit 320 to gate the first clock signal by setting the first control signal to the second logic value. However, it is to be appreciated that the control signal is not limited to this example. In certain aspects, the first clock gating circuit 320 is configured to output a logic zero at the output 324 (i.e., park the output 324 low) when the first clock signal is gated.

The second clock gating circuit 330 is configured to receive the second control signal from the control circuit 350 via the control input 336, and pass or gate (i.e., block) the second clock signal based on the second control signal. For example, the second clock gating circuit 330 may be configured to pass the second clock signal when the second control signal has a first logic value, and gate the second clock signal when the second control signal has a second logic value. The first logic value may be logic one and the second logic value may be logic zero, or vice versa. Thus, in this example, the control circuit 350 may cause the second clock gating circuit 330 to pass the second clock signal by setting the second control signal to the first logic value, and cause the second clock gating circuit 330 to gate the second clock signal by setting the second control signal to the second logic value. However, it is to be appreciated that the control signal is not limited to this example. In certain aspects, the second clock gating circuit 330 is configured to output a logic zero at the output 334 (i.e., park the output 334 low) when the second clock signal is gated.

To select the first clock source 210 in a first mode, the control circuit 350 causes the first clock gating circuit 320 to pass the first clock signal from the first clock source 210 to the first input 342 of the OR gate 340. The control circuit 350 also causes the second clock gating circuit 330 to gate the second clock signal from the second clock source 220 and output a logic zero to the second input 344 of the OR gate 340. Thus, the first input 342 of the OR gate 340 receives the first clock signal, and the second input 344 is held at logic zero. This causes the OR gate 340 to pass the first clock signal from the first clock source 210 to the clock path 120, and therefore select the first clock source 210.

To select the second clock source 220 in a second mode, the control circuit 350 causes the second clock gating circuit 330 to pass the second clock signal from the second clock source 220 to the second input 344 of the OR gate 340. The control circuit 350 also causes the first clock gating circuit 320 to gate the first clock signal from the first clock source 210 and output a logic zero to the first input 342 of the OR gate 340. Thus, the first input 342 of the OR gate 340 is held at logic zero, and the second input 344 of the OR gate 340 receives the second clock signal. This causes the OR gate 340 to pass the second clock signal from the second clock source 220 to the clock path 120, and therefore select the second clock source 220.

Thus, the circuit 310 allows the control circuit 350 to select the first clock source 210 or the second clock source 220 by controlling the first clock gating circuit 320 and the second clock gating circuit 330, and therefore provides clock switching functionality. In other words, the first and second clock gating circuits 320 and 330 in combination with the OR gate 340 provide clock switching functionality by arranging the first and second clock gating circuits 320 and 330 before the OR gate 340, as shown in the example in FIG. 3.

The circuit 310 also allows the control circuit 350 to prevent the generation of a glitch during a clock switch by sequencing the gating functions of the first clock gating circuit 320 and the second clock gating circuit 330 during the clock switch. For example, the control circuit 350 may switch the clock path 120 from first clock source 210 to the second clock source 220 without generating a glitch as follows. Initially, the first clock gating circuit 320 passes the first clock signal from the first clock source 210, and the second clock gating circuit 330 gates the second clock signal from the second clock source 220 since the first clock source 210 is initially selected. The control circuit 350 then causes the first clock gating circuit 320 to gate the first clock signal from the first clock source 210 while the second clock gating circuit 330 continues to gate the second clock signal from the second clock source 220. After the first clock gating circuit 320 gates the first clock signal and outputs a logic zero to the first input 342 of the OR gate 340, the control circuit 350 causes the second clock gating circuit 330 to pass the second clock signal from the second clock source 220 to the second input 344 of the OR gate 340, causing the circuit 310 to select the second clock source 220.

The control circuit 350 may also switch the clock path 120 from the second clock source 220 to the first clock source 210 without generating a glitch as follows. Initially, the second clock gating circuit 330 passes the second clock signal from the second clock source 220, and the first clock gating circuit 320 gates the first clock signal from the first clock source 210 since the second clock source 220 is initially selected. The control circuit 350 then causes the second clock gating circuit 330 to gate the second clock signal from the second clock source 220 while the first clock gating circuit 320 continues to gate the first clock signal from the first clock source 210. After the second clock gating circuit 330 gates the second clock signal and outputs a logic zero to the second input 344 of the OR gate 340, the control circuit 350 causes the first clock gating circuit 320 to pass the first clock signal from the first clock source 210 to the first input 342 of the OR gate 340, causing the circuit 310 to select the first clock source 210.

Thus, the circuit 310 provides clock switching functionality while preventing the generation of glitches by sequencing the gating functions of the first clock gating circuit 320 and the second clock gating circuit 330. The OR gate 340 has a smaller number of components compared to a glitch-free multiplexer. This is because the OR gate 340 does not need to include the circuitry in the glitch-free multiplexer for preventing glitches since glitches are prevented in the circuit 310 by sequencing the gating functions of the first clock gating circuit 320 and the second clock gating circuit 330, which are located before the OR gate 340.

The circuit 310 prevents glitches during clock switching using a smaller number of components in the path of the selected clock signal (e.g., selected one of the first clock signal and the second clock signal) compared to the multiplexer 230 implemented with a glitch-free multiplexer. This is because the OR gate 340 includes a smaller number of components than the glitch-free multiplexer, and therefore reduces the number of components in the path of the selected clock. The smaller number of components in the path of the selected clock improves clock quality (e.g., reduces jitter). The improved clock quality allows the system 305 to meet tighter timing requirements for operation at higher clock frequencies (e.g., to support higher data rates).

Note that in both systems 205 and 305, the selected clock signal (e.g., selected one of the first clock signal and the second clock signal) passes through a clock gating circuit. In the system 205, the selected clock signal passes through the clock gating circuit 130, and, in the system 305, the selected clock signal passes through one of the first and second clock gating circuits 320 and 330 depending on which one of the first clock signal and the second clock signal is selected. Since the selected clock signal passes through one of the first and second clock gating circuits 320 and 330 in the circuit 310, the first and second clock gating circuits 320 and 330 do not add additional components in the path of the selected clock signal compared to the clock gating circuit 130 in FIG. 2, assuming each of the clock gating circuits 130, 320, and 330 has the same number of components.

The circuit 310 also provides clock gating functionality. To gate both the first clock signal and the second clock signal (i.e., block both clock signals from the clock path 120), the control circuit 350 causes the first clock gating circuit 320 to gate the first clock signal and output a logic zero to the first input 342 of the OR gate 340, and causes the second clock gating circuit 330 to gate the second clock signal and output a logic zero to the second input 344 of the OR gate 340. In this case, the OR gate 340 outputs a logic zero to the clock path 120.

Thus, the circuit 310 provides both clock switching functionality and clock gating functionality while reducing the number of components in the path of the selected clock signal for improved clock quality. In this regard, the circuit 310 may also be referred to as a multiplexer in which the multiplexer has clock gating functionality.

Figure 4:
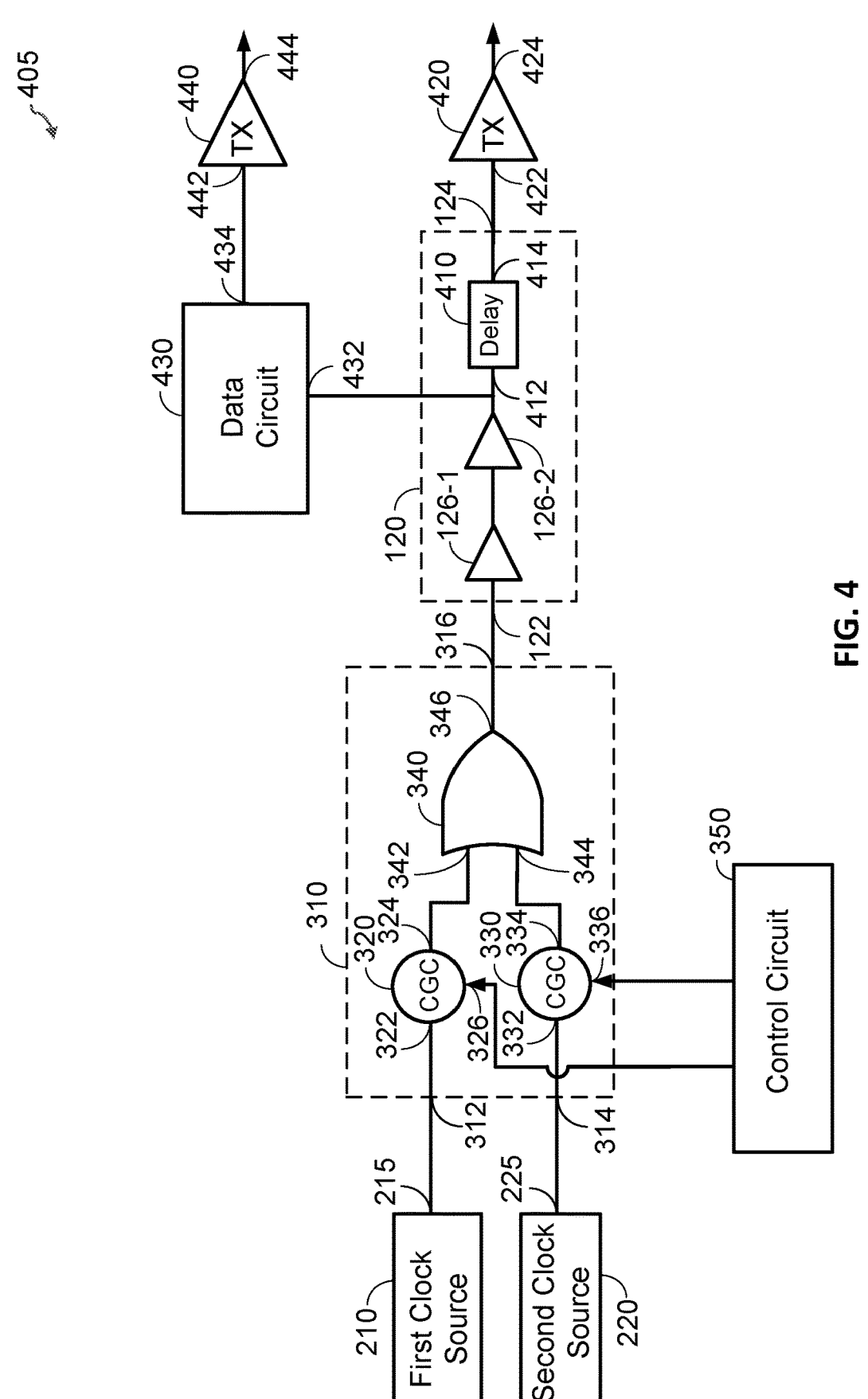
FIG. 4 shows an example in which the exemplary circuit shown in FIG. 3 is used to facilitate data transfer according to circuit aspects of the present disclosure.

The circuit 310, the first clock source 210, the second clock source 220, and the clock path 120 may be used, for example, in an interface circuit to facilitate the transfer of data from a first chip to a second chip. In this regard, FIG. 4 shows an example of a system 405 configured to transfer data from a first chip to a second chip according to certain aspects. In this example, the system 405 may be integrated on the first chip, which is coupled to the second chip (not shown) via multiple links (not shown). In one example, the system 305 is used in a memory interface circuit that interfaces a memory controller on the first chip with a memory (e.g., a double data rate (DDR) memory or a low power DDR (LPDDR) memory) on the second chip. However, it is to be appreciated that the system 405 is not limited to this example.

In the example shown in FIG. 4, the system 405 includes the circuit 310, the first clock source 210, the second clock source 220, and the clock path 120 discussed above with reference to FIG. 3. The system 405 also includes a clock transmitter 420 (also referred to as a driver), data circuit 430, and a data transmitter 440.

The clock transmitter 420 has an input 422 coupled to the output 424 of the clock path 120, and an output 424 coupled to the second chip (not shown) via a link (not shown). The clock transmitter 420 is configured to receive a clock signal from the clock path 120, and transmit the clock signal to the second chip via the link. The clock signal from the clock path 120 may be the selected one of the first clock signal and the second clock signal (i.e., the clock transmitter 420 transmits the first clock signal when the circuit 310 selects the first clock signal, and transmits the second clock signal when the circuit 310 selects the second clock signal).

The data circuit 430 has an input 432 coupled to the clock path 120, and an output 434 coupled to the data transmitter 440. The input 432 may be coupled to the clock path 120 at various locations (i.e., points) along the clock path 120, and is therefore not limited to the exemplary location shown in FIG. 4.

The data circuit 430 is configured to generate a data signal including data bits to be transmitted to the second chip, and output the data signal at the output 434. The data circuit 430 is also configured to receive the selected clock signal (i.e., selected one of the first clock signal and the second clock signal) from the clock path 120 via the input 432, and time operations of the data circuit 430 based on the selected clock signal. For example, the data circuit 430 may output two bits of the data signal per cycle (i.e., period) of the selected clock signal for double data rate (DDR) operation. In another example, the data circuit 430 may output one bit of the data signal per cycle (i.e., period) of the selected clock signal for signal data rate (SDR). However, it is to be appreciated that the data circuit 430 is not limited to this example.

In the example shown in FIG. 4, the data transmitter 440 has an input 442 coupled to the output 434 of the data circuit 430, and an output 444 coupled to the second chip (not shown) via a link (not shown). The data transmitter 440 is configured to receive the data signal (e.g., DDR data signal or a SDR data signal) from the data circuit 430, and transmit the data signal to the second chip via the link. A data sampler (not shown) at the second chip may sample the received data signal using the clock signal received by the second chip from the clock transmitter 420.

In the example shown in FIG. 4, the clock path 120 further includes a delay circuit 410 used to adjust the timing of the selected clock signal (i.e., the selected one of the first clock signal and the second clock signal). The delay circuit 410 has an input 412 and an output 414. In the example shown in FIG. 4, the input 412 is coupled to clock buffer 126-2 and the output 414 is coupled to the output 124 of the clock path 120. However, it is to be appreciated that the present disclosure is not limited to this example, and that the delay circuit 410 may be placed at a different location in the clock path 120. In certain aspects, the delay circuit 410 may be implemented with delay buffers (also referred to as delay stages) coupled in series in which the delay of the delay circuit 410 is approximately equal to the sum of the delays of the delay buffers.

In operation, the delay circuit 410 is configured to receive the selected clock signal at the input 412, delay the selected clock signal by a delay of the delay circuit 410, and output the resulting delayed clock signal at the output 414. In certain aspects, the delay of the delay circuit 410 is used to adjust the timing of the selected clock signal with respect to the data signal or another signal. For example, the delay of the delay circuit 410 may be used to center align the selected clock signal with the data signal, in which edges of the selected clock signal are located between bit transitions in the data signal. However, it is to be appreciated that the present disclosure is not limited to this example, and that other delays may be used. In general, the delay of the delay circuit 410 may be set to a delay that achieves a desired timing relationship between the selected clock signal and the data signal or between the selected clock signal and another signal.

It is to be appreciated that the system may include one or more additional components not shown in FIG. 4. For example, in some implementations, the system 405 may include a duty cycle adjuster coupled between the delay circuit 410 and the clock transmitter 420 to correct for duty cycle distortion.

Figure 5:
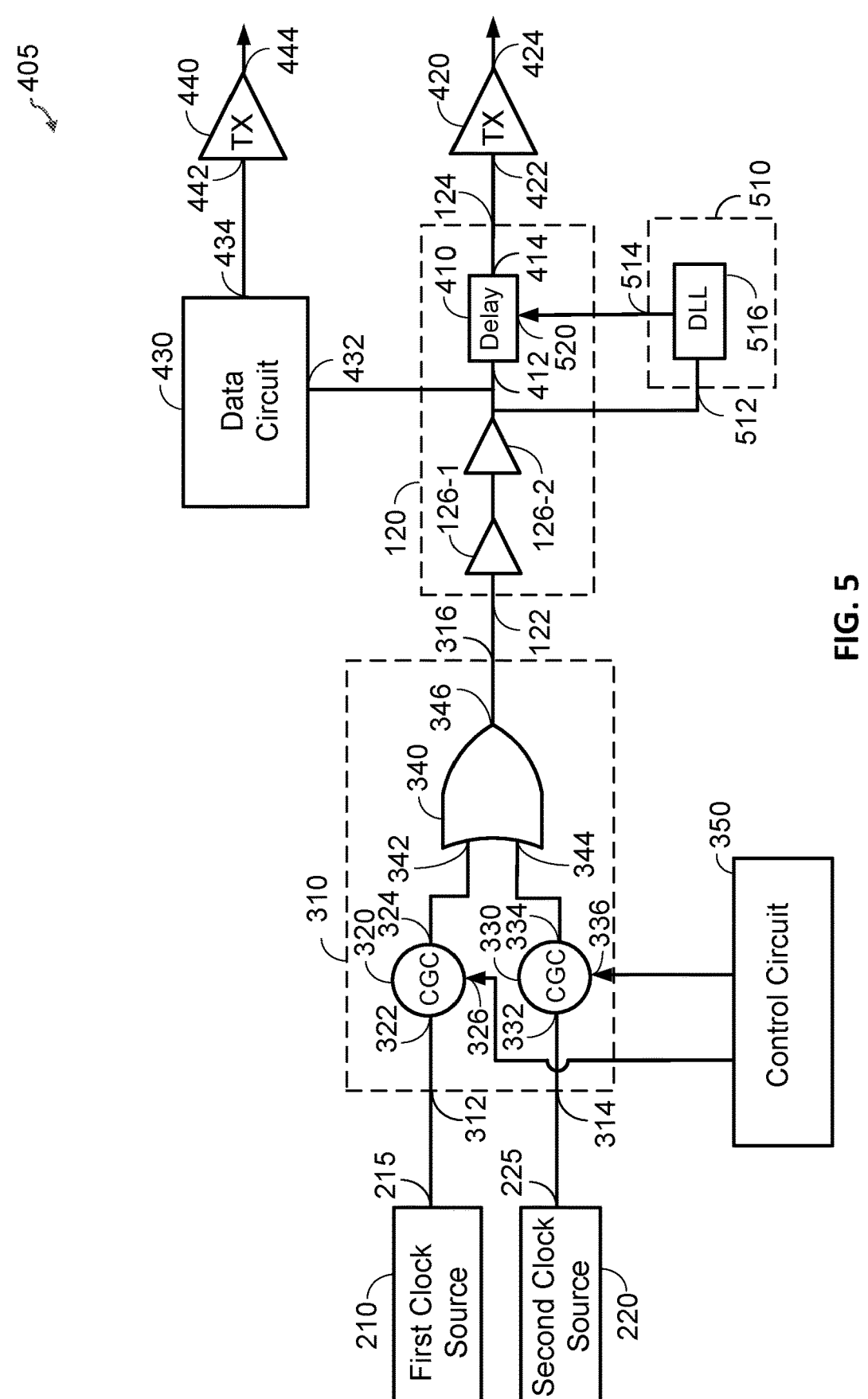
FIG. 5 shows an example in which the delay of a delay circuit is controlled by a delay control circuit according to certain aspects of the present disclosure.

In certain aspects, the delay of the delay circuit 410 may be controlled by a delay control circuit. In this regard, FIG. 5 shows an example in which the system 405 further includes a delay control circuit 510 configured to control the delay of the delay circuit 410 according to certain aspects. In this example, the delay circuit 410 has a control input 520, and is configured to set the delay of the delay circuit 410 based on a delay control signal received at the control input 520 from the delay control circuit 510. The delay control circuit 510 has an input 512 coupled to the input 412 of the delay circuit 410, and an output 514 coupled to the control input 520 of the delay circuit 410.

In this example, the delay control circuit 510 is configured to receive the selected clock signal at the input 512, and use the selected clock signal as a timing reference to set the delay of the delay circuit 410 using the delay control signal. For example, the delay control circuit 510 may use the clock signal as a timing reference to set the delay of the delay circuit 410 to a desired fraction of one cycle (i.e., one period) of the selected clock signal. For example, the delay control circuit 510 may set the delay of the delay circuit 410 to a fraction of one cycle of the selected clock cycle that center aligns the selected clock path with the data signal. However, it is to be appreciated that the present disclosure is not limited to this example. In general, the delay control circuit 510 may set the delay of the delay circuit 410 to a delay corresponding to a fraction of one clock cycle that achieves a desired timing relationship between the selected clock signal and the data signal or between the selected clock signal and another signal.

In certain aspects, the delay control circuit 510 may be implemented with a delay-locked loop (DLL). In this regard, FIG. 5 shows an example in which the delay control circuit 510 includes a DLL 516 according to certain aspects. The use of a DLL for generating a delay control signal based on a reference clock signal to control the delay of a delay circuit is known in the art. In the example in FIG. 5, the reference clock signal for the DLL 516 is the selected one of the first clock signal and the second clock signal.

It is to be appreciated that a system may include multiple instances of the circuit 310 and multiple clock paths. For example, multiple instances of the circuit 310 may be used in a system including parallel clock paths according to certain aspects, an example of which is shown in FIG. 6.

Figure 6:
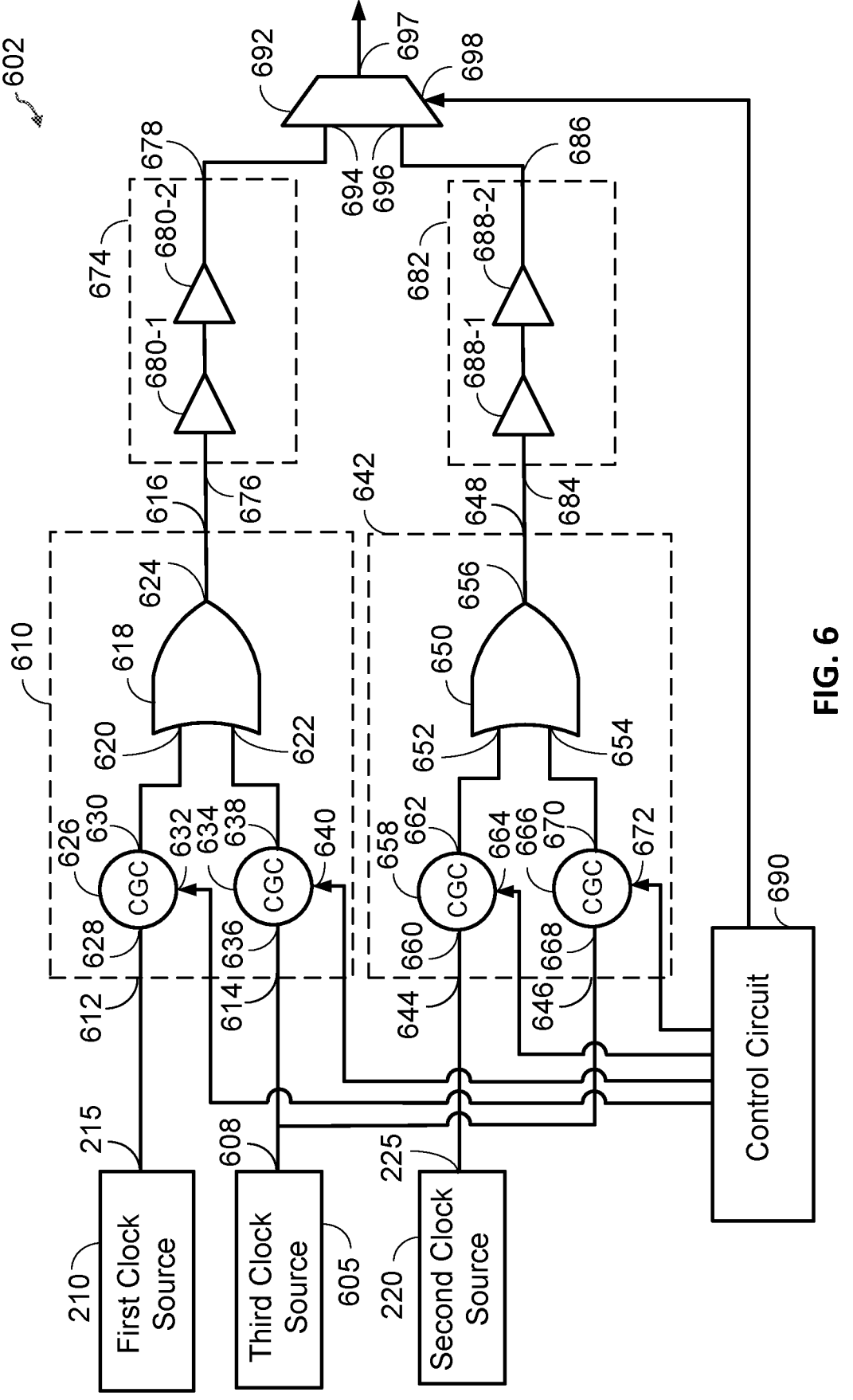
FIG. 6 shows an example of a system including parallel clock paths according to certain aspects of the present disclosure.

FIG. 6 shows an example of a system 602 including the first clock source 210 and the second clock source 220 discussed above. The system 602 also includes a first clock path 674, a second clock path 682, a third clock source 605, a first circuit 610, a second circuit 642, and a multiplexer 692. Each of the first circuit 610 and the second circuit 642 may be implemented with a separate instance (i.e., copy) of the exemplary circuit 310 shown in FIG. 3.

The third clock source 605 is configured to generate a third clock signal, and output the third clock signal at an output 608 of the third clock source 605. For example, the third clock source 605 may be implemented with a phase-locked loop (PLL). In another example, the third clock source 605 may derive the third clock signal from the first clock signal or the second clock signal. For example, the third clock source 605 may include a frequency divider configured to receive the first clock signal or the second clock signal and divide the frequency of the first clock signal or the second clock signal to generate the third clock signal.

In another example, the third clock source 605 may include a multiplexer configured to receive clock signals from multiple clock sources, select the clock signal from one of the multiple clock sources, and output the clock signal from the selected one of the multiple clock sources as the third clock signal.

The first circuit 610 has a first input 612 coupled to the output 215 of the first clock source 210, a second input 614 coupled to the output 608 of the third clock source 605, and an output 616. In this example, the first circuit 610 includes a first clock gating circuit 626, a second clock gating circuit 634, and a first OR gate 618. The first OR gate 618 has a first input 620, a second input 622, and an output 624.

The first clock gating circuit 626 is coupled between the first input 612 of the first circuit 610 and the first input 620 of the first OR gate 618, the second clock gating circuit 634 is coupled between the second input 614 of the first circuit 610 and the second input 622 of the first OR gate 618, and the output 624 of the first OR gate 618 is coupled to the output 616 of the first circuit 610. In the example in FIG. 6, the first clock gating circuit 626 has an input 628 coupled to the first input 612 of the first circuit 610, and an output 630 coupled to the first input 620 of the first OR gate 618. The second clock gating circuit 634 has an input 636 coupled to the second input 614 of the first circuit 610, and an output 638 coupled to the second input 622 of the first OR gate 618.

In certain aspects, the system 602 includes a control circuit 690 coupled to the first clock gating circuit 626 and the second clock gating circuit 634. The control circuit 690 is configured to generate a first control signal and output the first control signal to a control input 632 of the first clock gating circuit 626 to control the gating function of the first clock gating circuit 626, as discussed further below. The control circuit 690 is also configured to generate a second control signal and output the second control signal to a control input 640 of the second clock gating circuit 634 to control the gating function of the second clock gating circuit 634, as discussed further below.

The first clock gating circuit 626 is configured to receive the first control signal from the control circuit 690 via the control input 632, and pass or gate (i.e., block) the first clock signal based on the first control signal. For example, the first clock gating circuit 626 may be configured to pass the first clock signal when the first control signal has a first logic value, and gate the first clock signal when the first control signal has a second logic value. The first logic value may be logic one and the second logic value may be logic zero, or vice versa. However, it is to be appreciated that the control signal is not limited to this example. In certain aspects, the first clock gating circuit 626 is configured to output a logic zero at the output 630 (i.e., park the output 630 low) when the first clock signal is gated.

The second clock gating circuit 634 is configured to receive the second control signal from the control circuit 690 via the control input 640, and pass or gate (i.e., block) the third clock signal based on the second control signal. For example, the second clock gating circuit 634 may be configured to pass the third clock signal when the second control signal has a first logic value, and gate the third clock signal when the third control signal has a second logic value. The first logic value may be logic one and the second logic value may be logic zero, or vice versa. However, it is to be appreciated that the control signal is not limited to this example. In certain aspects, the second clock gating circuit 634 is configured to output a logic zero at the output 638 (i.e., park the output 638 low) when the third clock signal is gated.

To select the first clock source 210, the control circuit 690 causes the first clock gating circuit 626 to pass (i.e., un-gate) the first clock signal from the first clock source 210 to the first input 620 of the first OR gate 618, and causes the second clock gating circuit 634 to gate the third clock signal from the third clock source 605 and output a logic zero to the second input 622 of the first OR gate 618. In this case, the first OR gate 618 passes the first clock signal to the output 616, and the first circuit 610 selects the first clock source 210.

To select the third clock source 605, the control circuit 690 causes the first clock gating circuit 626 to gate the first clock signal from the first clock source 210 and output a logic zero to the first input 620 of the first OR gate 618, and causes the second clock gating circuit 634 to pass the third clock signal from the third clock source 605 to the second input 622 of the first OR gate 618. In this case, the first OR gate 618 passes the third clock signal to the output 616, and the first circuit 610 selects the third clock source 605.

To gate both the first clock signal and the third clock signal, the control circuit 690 causes the first clock gating circuit 626 to gate the first clock signal and output a logic zero to the first input 620 of the first OR gate 618, and causes the second clock gating circuit 634 to gate the third clock signal and output a logic zero to the second input 622 of the first OR gate 618. In this case, the first OR gate 618 output a logic zero to the output 616, and the first circuit 610 gates the both the first clock signal and the third clock signal.

The second circuit 642 has a first input 644 coupled to the output 225 of the second clock source 220, a second input 646 coupled to the output 608 of the third clock source 605, and an output 648. In this example, the second circuit 642 includes a third clock gating circuit 658, a fourth clock gating circuit 666, and a second OR gate 650. The second OR gate 650 has a first input 652, a second input 654, and an output 656.

The third clock gating circuit 658 is coupled between the first input 644 of the second circuit 642 and the first input 652 of the second OR gate 650, the fourth clock gating circuit 666 is coupled between the second input 646 of the second circuit 642 and the second input 654 of the second OR gate 650, and the output 656 of the second OR gate 650 is coupled to the output 648 of the second circuit 642. In the example in FIG. 6, the third clock gating circuit 658 has an input 660 coupled to the first input 644 of the second circuit 642, and an output 662 coupled to the first input 652 of the second OR gate 650. The fourth clock gating circuit 666 has an input 668 coupled to the second input 646 of the second circuit 642 and an output 670 coupled to the second input 654 of the second OR gate 650.

The control circuit 690 is coupled to the third clock gating circuit 658 and the fourth clock gating circuit 666. The control circuit 690 is configured to generate a third control signal and output the third control signal to a control input 664 of the third clock gating circuit 658 to control the gating function of the third clock gating circuit 658, as discussed further below. The control circuit 690 is also configured to generate a fourth control signal and output the fourth control signal to a control input 672 of the fourth clock gating circuit 666 to control the gating function of the fourth clock gating circuit 666, as discussed further below.

The third clock gating circuit 658 is configured to receive the third control signal from the control circuit 690 via the control input 664, and pass or gate (i.e., block) the second clock signal based on the third control signal. For example, the third clock gating circuit 658 may be configured to pass the second clock signal when the third control signal has a first logic value, and gate the second clock signal when the third control signal has a second logic value. The first logic value may be logic one and the second logic value may be logic zero, or vice versa. However, it is to be appreciated that the third control signal is not limited to this example. In certain aspects, the third clock gating circuit 658 is configured to output a logic zero at the output 662 (i.e., park the output 662 low) when the second clock signal is gated.

The fourth clock gating circuit 666 is configured to receive the fourth control signal from the control circuit 690 via the control input 672, and pass or gate (i.e., block) the third clock signal based on the fourth control signal. For example, the fourth clock gating circuit 666 may be configured to pass the third clock signal when the fourth control signal has a first logic value, and gate the third clock signal when the fourth control signal has a second logic value. The first logic value may be logic one and the second logic value may be logic zero, or vice versa. However, it is to be appreciated that the fourth control signal is not limited to this example. In certain aspects, the fourth clock gating circuit 666 is configured to output a logic zero at the output 670 (i.e., park the output 670 low) when the third clock signal is gated.

To select the second clock source 220, the control circuit 690 causes the third clock gating circuit 658 to pass (i.e., un-gate) the second clock signal from the second clock source 220 to the first input 652 of the second OR gate 650, and causes the fourth clock gating circuit 666 to gate the third clock signal from the third clock source 605 and output a logic zero to the second input 654 of the second OR gate 650. In this case, the second OR gate 650 passes the second clock signal to the output 648, and the second circuit 642 selects the second clock source 220.

To select the third clock source 605, the control circuit 690 causes the third clock gating circuit 658 to gate the second clock signal from the second clock source 220 and output a logic zero to the first input 652 of the second OR gate 650, and causes the fourth clock gating circuit 666 to pass the third clock signal from the third clock source 605 to the second input 654 of the second OR gate 650. In this case, the second OR gate 650 passes the third clock signal to the output 648, and the second circuit 642 selects the third clock source 605.

To gate both the second clock signal and the third clock signal, the control circuit 690 causes the third clock gating circuit 658 to gate the second clock signal and output a logic zero to the first input 652 of the second OR gate 650, and causes the fourth clock gating circuit 666 to gate the third clock signal and output a logic zero to the second input 654 of the second OR gate 650. In this case, the second OR gate 650 output a logic zero to the output 648, and the second circuit 642 gates both the second clock signal and the third clock signal.

In the example shown in FIG. 6, the first clock path 674 has an input 676 coupled to the output 616 of the first circuit 610, and an output 678. The first clock path 674 may include respective clock buffers 680-1 and 680-2 coupled in series. The second clock path 682 has an input 684 coupled to the output 648 of the second circuit 642, and an output 686. The second clock path 682 may include respective clock buffers 688-1 and 688-2 coupled in series. It is to be appreciated that each of the clock paths 674 and 682 may have a different number of clock buffers than shown in the example in FIG. 6. For example, the number of clock buffers in each of the clock paths 674 and 682 may depend on, for example, the length of the clock path, the drive strengths of the clock buffers in the clock path, the load coupled to the clock path, etc.

The multiplexer 692 has a first input 694, a second input 696, a select input 698, and an output 697. The first input 694 is coupled to the output 678 of the first clock path 674, the second input 696 is coupled to the output 686 of the second clock path 682, and the select input 698 is coupled to the control circuit 690. The output 697 may be coupled to the clock transmitter 420 (e.g., via the delay circuit 410), and/or another circuit. The multiplexer 692 is configured to select one of the first input 694 and the second input 696 based on a select signal received at the select input 698 from the control circuit 690, and couple the selected one of the first input 694 and the second input 696 to the output 697. Thus, the first multiplexer 692 selectively couples the first clock path 674 or the second clock path 682 to the output 697 based on the select signal from the control circuit 690.

The first and the second circuits 610 and 642 and the multiplexer 692 allow the system 602 to select the first clock source 210, the second clock source 220, or the third clock source 605 (e.g., to support different frequency modes where each of the clock sources 210, 220, and 605 has a different frequency). For example, in a first mode, the first clock source 210 is selected. In the first mode, the control circuit 690 causes the first circuit 610 to select the first clock source 210, causes the second circuit 642 to gate the second and third clock signals, and causes the multiplexer 692 to select the first input 694 of the multiplexer 692. In this case, the first clock signal from the first clock source 210 propagates through the first clock path 674 to the first input 694 of the multiplexer 692, and the multiplexer 692 passes the first clock signal to the output 697 of the multiplexer 692.

In a second mode, the second clock source 220 is selected. In the second mode, the control circuit 690 causes the first circuit 610 to gate the first and third clock signals, causes the second circuit 642 to select the second clock source 220, and causes the multiplexer 692 to select the second input 696 of the multiplexer 692. In this case, the second clock signal from the second clock source 220 propagates through the second clock path 682 to the second input 696 of the multiplexer 692, and the multiplexer 692 passes the second clock signal to the output 697 of the multiplexer 692.

In a third mode, the third clock source 605 is selected. In the third mode, the control circuit 690 causes the first circuit 610 to gate the first and third clock signals, causes the second circuit 642 to select the third clock source 605, and causes the multiplexer 692 to select the second input 696 of the multiplexer 692. In this case, the third clock signal from the third clock source 605 propagates through the second clock path 682 to the second input 696 of the multiplexer 692, and the multiplexer 692 passes the third clock signal to the output 697 of the multiplexer 692. In this example, having the third clock signal propagate through the second clock path 682 facilitates clock switching between the first clock source 210 and the third clock source 605, as discussed further below.

In a fourth mode, the third clock source 605 is also selected. In the fourth mode, the control circuit 690 causes the second circuit 642 to gate the second and third clock signals, causes the first circuit 610 to select the third clock source 605, and causes the multiplexer 692 to select the first input 694 of the multiplexer 692. In this case, the third clock signal from the third clock source 605 propagates through the first clock path 674 to the first input 694 of the multiplexer 692, and the multiplexer 692 passes the third clock signal to the output 697 of the multiplexer 692. In this example, having the third clock signal propagate through the first clock path 674 facilitates clock switching between the second clock source 220 and the third clock source 605, as discussed further below. Thus, in the third mode, the third clock signal propagates through the second clock path 682, and in the fourth mode, the third clock signal propagates through the first clock path 674.

The system 602 may switch from the first clock source 210 to the second clock source 220 as follows. Initially, the first circuit 610 selects the first clock source 210, the second circuit 642 gates the second and third clock signals, and the multiplexer 692 selects the first input 694 (i.e., the first clock path 674). Before the clock switch, the control circuit 690 causes the clock gating circuits 626, 634, 658, and 666 to gate the respective clock signals. After the clock signals are gated, the control circuit 690 causes the multiplexer 692 to select the second input 696 (i.e., switch from the first input 694 to the second input 696) to switch to the second clock path 682. After the multiplexer 629 switches inputs, the control circuit 690 causes the third clock gating circuit 658 to pass the second clock signal from the second clock source 220 (i.e., causes the second circuit 642 to select the second clock signal). The second clock signal propagates through the second clock path 682 to the multiplexer 692, which passes the second clock signal to the output 697.

The system 602 may switch from the second clock source 220 to the first clock source 210 as follows. Initially, the second circuit 642 selects the second clock source 220, the first circuit 610 gates the first and third clock signals, and the multiplexer 692 selects the second input 696 (i.e., the second clock path 682). Before the clock switch, the control circuit 690 causes the clock gating circuits 626, 634, 658, and 666 to gate the respective clock signals. After the clock signals are gated, the control circuit 690 causes the multiplexer 692 to select the first input 694 (i.e., switch from the second input 696 to the first input 694) to switch to the first clock path 674. After the multiplexer 692 switches inputs, the control circuit 690 causes the first clock gating circuit 626 to pass the first clock signal from the first clock source 210 (i.e., causes the first circuit 610 to select the first clock signal). The first clock signal propagates through the first clock path 674 to the multiplexer 692, which passes the first clock signal to the output 697.

The system 602 may switch from the first clock source 210 to the third clock source 605 as follows. Initially, the first circuit 610 selects the first clock source 210, the second circuit 642 gates the second and third clock signals, and the multiplexer 692 selects the first input 694 (i.e., the first clock path 674). Before the clock switch, the control circuit 690 causes the clock gating circuits 626, 634, 658, and 666 to gate the respective clock signals. After the clock signals are gated, the control circuit 690 causes the multiplexer 692 to select the second input 696 (i.e., switch from the first input 694 to the second input 696) to switch to the second clock path 682. After the multiplexer 692 switches input, the control circuit 690 causes the fourth clock gating circuit 666 to pass the third clock signal from the third clock source 605 (i.e., causes the second circuit 642 to select the third clock signal). The third clock signal propagates through the second clock path 682 to the multiplexer 692, which passes the third clock signal to the output 697.

The system 602 may switch from the third clock source 605 to the first clock source 210 as follows. Initially the second circuit 642 selects the third clock source 605, the first circuit 610 gates the first and third clock signals, and the multiplexer 692 selects the second input 696 (i.e., the second clock path 682). Before the clock switch, the control circuit

690 causes the clock gating circuits 626, 634, 658, and 666 to gate the respective clock signals. After the clock signals are gated, the control circuit 690 causes the multiplexer 692 to select the first input 694 (i.e., switch from the second input 696 to the first input 694) to switch to the first clock path 674. After the multiplexer 692 switches inputs, the control circuit 690 causes the first clock gating circuit 626 to pass the first clock signal from the first clock source 210 (i.e., causes the first circuit 610 to select the first clock signal). The first clock signal propagates through the first clock path 674 to the multiplexer 692, which passes the first clock signal to the output 697.

The system 602 may switch from the second clock source 220 to the third clock source 605 as follows. Initially, the second circuit 642 selects the second clock source 220, the first circuit 610 gates the first and third clock signals, and the multiplexer selects the second input 696 (i.e., the second clock path 682). Before the clock switch, the control circuit 690 causes the clock gating circuits 626, 634, 658, and 666 to gate the respective clock signals. After the clock signals are gated, the control circuit 690 causes the multiplexer 692 to select the first input 694 (i.e., switch from the second input 696 to the first input 694) to switch to the first clock path 674. After the multiplexer 692 switches inputs, the control circuit 690 causes the second clock gating circuit 634 to pass the third clock signal from the third clock source 605 (i.e., causes the first circuit 610 to select the third clock signal). The third clock signal propagates through the first clock path 674 to the multiplexer 692, which passes the third clock signal to the output 697.

The system 602 may switch from the third clock source 605 to the second clock source 220 as follows. Initially, the first circuit 610 selects the third clock source 605, the second circuit 642 gates the second and third clock signals, and the multiplexer 692 selects the first input 694 (i.e., the first clock path 674). Before the clock switch, the control circuit 690 causes the clock gating circuits 626, 634, 658, and 666 to gate the respective clock signals. After the clock signals are gated, the control circuit 690 causes the multiplexer 692 to select the second input 696 (i.e., switch from the first input 694 to the second input 696) to switch to the second clock path 682. After the multiplexer 629 switches inputs, the control circuit 690 causes the third clock gating circuit 658 to pass the second clock signal from the second clock source 220 (i.e., causes the second circuit 642 to select the second clock signal). The second clock signal propagates through the second clock path 682 to the multiplexer 692, which passes the second clock signal to the output 697.

In the examples discussed above, the control circuit 690 causes the clock gating circuits 626, 634, 658, and 666 to gate the respective clock signals before the multiplexer 692 switches inputs (i.e., switches from the first input 694 to the second input 696, or vice versa) to switch clock signals. Gating the clock signals causes both the first input 694 and the second input 696 of the multiplexer 692 to be low, which helps avoid a glitch when the multiplexer 692 switches inputs. Thus, a glitch is prevented at the multiplexer 692 by controlling the gating functions of the clock gating circuits 626, 634, 658, and 666 without the need for implementing the multiplexer 692 with a glitch-free multiplexer. This allows the multiplexer 692 to be implemented with fewer components in the path of the selected clock signal, which helps improve clock quality (e.g., improve jitter performance).

Figure 7:
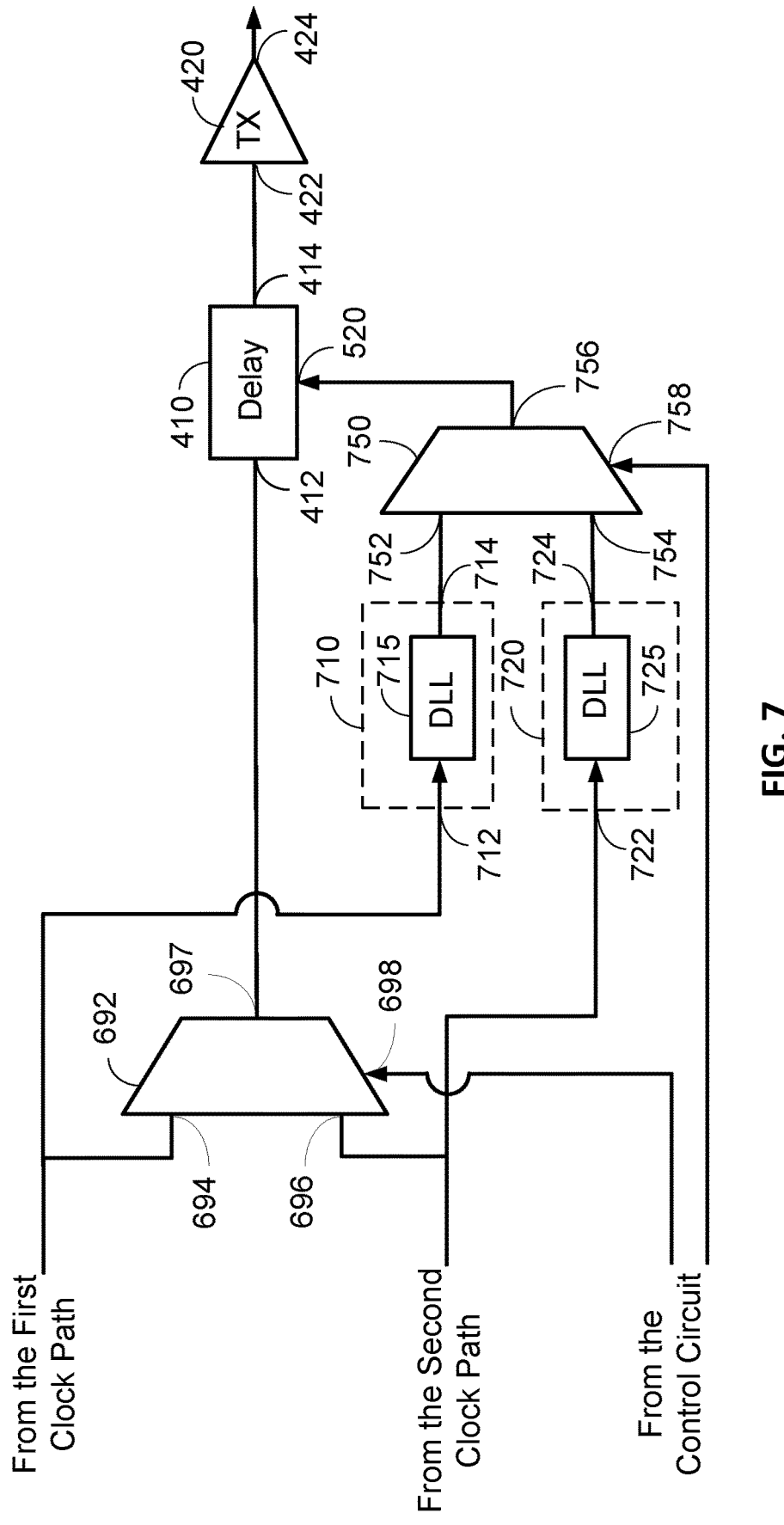
FIG. 7 shows an example of a system including a first delay control circuit and a second delay control circuit according to certain aspects of the present disclosure.

FIG. 7 shows an example in which the system 602 further includes the delay circuit 410 and the clock transmitter 420 discussed above. Note that the clock sources 210, 220, and

605, the first and second circuits 610 and 642, and the clock paths 674 and 682 are not shown in FIG. 7 for ease of illustration.

In this example, the input 412 of the delay circuit 410 is coupled to the output 697 of the multiplexer 692, and the input 422 of the clock transmitter 420 is coupled to the output 414 of the delay circuit 410. The delay circuit 410 is configured to delay the selected clock signal (i.e., selected one of the first clock signal, the second clock signal, and the third clock signal) output by the multiplexer 692. For example, the delay circuit 410 may delay the selected clock signal to adjust the timing of the selected clock signal (e.g., based on a desired timing relationship between the selected clock signal and the data signal output by the data circuit 430 (shown in FIG. 4)). As discussed above, the clock transmitter 420 may be configured to transmit the selected clock signal to the second chip via a link.

In the example shown in FIG. 7, the system 602 further includes a first delay control circuit 710, a second delay control circuit 720, and a second multiplexer 750. As discussed further below, the system 602 may alternate between the first delay control circuit 710 and the second delay control circuit 720 to help reduce clock switching latency. In the discussion below, the multiplexer 692 is referred to as the first multiplexer.

The first delay control circuit 710 has an input 712 and an output 714. The input 712 is coupled to the output 678 of the first clock path 674 (shown in FIG. 6), and thus receives the first clock signal or the third clock signal propagating through the first clock path 674. The first delay control circuit 710 is configured to use the first clock signal or the third clock signal from the first clock path 674 as a timing reference to generate a first delay control signal, and output the first delay control signal at the output 714. For example, the first delay control signal may set the delay of the delay circuit 410 to a desired fraction of one cycle of the first clock signal or the third clock signal. In certain aspects, the first delay control circuit 710 may include a first DLL 715, as shown in the example in FIG. 7. However, it is to be appreciated that the present disclosure is not limited to this example.

The second delay control circuit 720 has an input 722 and an output 724. The input 722 is coupled to the output 686 of the second clock path 682 (shown in FIG. 6), and thus receives the second clock signal or the third clock signal propagating through the second clock path 682. The second delay control circuit 720 is configured to use the second clock signal or the third clock signal from the second clock path 682 as a timing reference to generate a second delay control signal, and output the second delay control signal at the output 724. For example, the second delay control signal may set the delay of the delay circuit 410 to a desired fraction of one cycle of the second clock signal or the third clock signal. In certain aspects, the second delay control circuit 720 may include a second DLL 725, as shown in the example in FIG. 7. However, it is to be appreciated that the present disclosure is not limited to this example.

The second multiplexer 750 has a first input 752, a second input 754, a select input 758, and an output 756. The first input 752 is coupled to the output 714 of the first delay control circuit 710, the second input 754 is coupled to the output 724 of the second delay control circuit 720, and the output 756 is coupled to the control input 520 of the delay circuit 410. The second multiplexer 750 is configured to select one of the first input 752 and the second input 754 based on a select signal received at the select input 758, and couple the selected one of the first input 752 and the second input 754 to the output 756. Thus, the second multiplexer 750 selectively couples the first delay control circuit 710 or the second delay control circuit 720 to the control input 520 of the delay circuit 410 based on the select signal. In the example shown in FIG. 7, the select input 758 is coupled to the control circuit 690 (shown in FIG. 6), which is configured to generate the select signal to control the second multiplexer 750. The select signal for the first multiplexer 692 and the select signal for the second multiplexer 750 may be the same or different.

In certain aspects, the control circuit 690 controls the second multiplexer 750 based on selection of the first multiplexer 692. For example, the control circuit 690 may cause the second multiplexer 750 to select the delay control circuit (e.g., first delay control circuit 710 or second delay control circuit 720) corresponding to the clock path (e.g., first clock path 674 or second clock path 682) that is selected by the first multiplexer 692. For example, when the first multiplexer 692 selects the first clock path 674, the control circuit 690 may cause the second multiplexer 750 to select the first delay control circuit 710 (which is coupled to the first clock path 674). When the first multiplexer 692 selects the second clock path 682, the control circuit 690 may cause the second multiplexer 750 to select the second delay control circuit 720 (which is coupled to the second clock path 682).

In this example, the system 602 may switch from the first clock source 210 to the second clock source 220 as follows. Initially, the first circuit 610 selects the first clock source 210, the second circuit 642 gates the second and third clock signals, and the first multiplexer 692 selects the first input 694 (i.e., the first clock path 674). Also, the first delay control circuit 710 generates the first delay control signal based on the first clock signal from the first clock path 674, and the second multiplexer 750 selects the first input 752 (i.e., the first delay control signal).

Before the clock switch, the control circuit 690 causes the third clock gating circuit 658 to pass the second clock signal. This allows the second clock signal to propagate through the second clock path 682 to the second delay control circuit 720. The second delay control circuit 720 locks onto the second clock signal and generates the second delay control signal based on the second clock signal. After the lock, the second delay control circuit 720 may enter a hold mode, in which the second delay control circuit 720 holds the generated second delay control signal (e.g., stores the second delay control signal in a register) and outputs the second delay control signal without continued need for the second clock signal. During the time the second delay control circuit 720 locks onto the second clock signal, the first multiplexer 692 may continue to pass the first clock signal from the first clock path 674 to the output 697, and the second multiplexer 750 may continue to pass the first delay control signal from the first delay control circuit 710 to control input 520 of the delay circuit 410.

After the second delay control circuit 720 is in the hold mode, the second delay control circuit 720 may send a signal to the control circuit 690 to proceed with the clock switch. In response, the control circuit 690 causes the clock gating circuits 626, 634, 658, and 666 to gate the respective clock signals. After the clock signals are gated, the control circuit 690 causes the first multiplexer 692 to select the second input 696 (i.e., switch from the first input 694 to the second input 696) to switch to the second clock path 682, and causes the second multiplexer 750 to select the second input 754 to switch to the second delay control circuit 720. After the first multiplexer 692 switches inputs, the control circuit 690 causes the third clock gating circuit 658 to pass the second clock signal from the second clock source 220. The second clock signal propagates through the second clock path 682 to the first multiplexer 692, which passes the second clock signal to the output 697. After the clock switch, the second delay control circuit 720 may exit the hold mode. In this example, the hold mode allows the second delay control circuit 720 to output the second delay control signal while the second clock signal is temporarily gated to allow the first multiplexer 692 to switch from the first input 694 to the second input 696.

In this example, the system 602 may switch from the second clock source 220 to the first clock source 210 as follows. Initially, the second circuit 642 selects the second clock source 220, the first circuit 610 gates the first and third clock signals, and the first multiplexer 692 selects the second input 696 (i.e., the second clock path 682). Also, the second delay control circuit 720 generates the second delay control signal based on the second clock signal from the second clock path 682, and the second multiplexer 750 selects the second input 754 (i.e., the second delay control signal).

Before the clock switch, the control circuit 690 causes the first clock gating circuit 626 to pass the first clock signal. This allows the first clock signal to propagate through the first clock path 674 to the first delay control circuit 710. The first delay control circuit 710 locks onto the first clock signal and generates the first delay control signal based on the first clock signal. After the lock, the first delay control circuit 710 may enter a hold mode, in which the first delay control circuit 710 holds the generated first delay control signal (e.g., stores the first delay control signal in a register) and outputs the first delay control signal without continued need for the first clock signal. During the time the first delay control circuit 710 locks onto the first clock signal, the first multiplexer 692 may continue to pass the second clock signal from the second clock path 682 to the output 697, and the second multiplexer 750 may continue to pass the second delay control signal from the second delay control circuit 720 to the control input 520 of the delay circuit 410.

After the first delay control circuit 710 is in the hold mode, the first delay control circuit 710 may send a signal to the control circuit 690 to proceed with the clock switch. In response, the control circuit 690 causes the clock gating circuits 626, 634, 658, and 666 to gate the respective clock signals. After the clock signals are gated, the control circuit 690 causes the first multiplexer 692 to select the first input 694 (i.e., switch from the second input 696 to the first input 694) to switch to the first clock path 674, and causes the second multiplexer 750 to select the first input 752 to switch to the first delay control circuit 710. After the first multiplexer 692 switches inputs, the control circuit 690 causes the first clock gating circuit 626 to pass the first clock signal from the first clock source 210. The first clock signal propagates through the first clock path 674 to the first multiplexer 692, which passes the first clock signal to the output 697. After the clock switch, the first delay control circuit 710 may exit the hold mode.

In this example, the system 602 may switch from the first clock source 210 to the third clock source 605 as follows. Initially, the first circuit 610 selects the first clock source 210, the second circuit 642 gates the second and third clock signals, and the first multiplexer 692 selects the first input 694 (i.e., the first clock path 674). Also, the first delay control circuit 710 generates the first delay control signal based on the first clock signal from the first clock path 674, and the second multiplexer 750 selects the first input 752 (i.e., the first delay control signal).

Before the clock switch, the control circuit 690 causes the fourth clock gating circuit 666 to pass the third clock signal. This allows the third clock signal to propagate through the second clock path 682 to the second delay control circuit 720. The second delay control circuit 720 locks onto the third clock signal and generates the second delay control signal based on the third clock signal. After the lock, the second delay control circuit 720 may enter the hold mode, in which the second delay control circuit 720 holds the generated second delay control signal (e.g., stores the second delay control signal in a register) and outputs the second delay control signal without continued need for the third clock signal.

After the second delay control circuit 720 is in the hold mode, the second delay control circuit 720 may send a signal to the control circuit 690 to proceed with the clock switch. In response, the control circuit 690 causes the clock gating circuits 626, 634, 658, and 666 to gate the respective clock signals. After the clock signals are gated, the control circuit 690 causes the first multiplexer 692 to select the second input 696 (i.e., switch from the first input 694 to the second input 696) to switch to the second clock path 682, and causes the second multiplexer 750 to select the second input 754 to switch to the second delay control circuit 720. After the first multiplexer 692 switches inputs, the control circuit 690 causes the fourth clock gating circuit 666 to pass the third clock signal from the third clock source 605. The third clock signal propagates through the second clock path 682 to the first multiplexer 692, which passes the third clock signal to the output 697. After the clock switch, the second delay control circuit 720 may exit the hold mode.

In this example, the system 602 may switch from the third clock source 605 to the first clock source 210 as follows. Initially, the second circuit 642 selects the third clock source 605, the first circuit 610 gates the first and third clock signals, and the first multiplexer 692 selects the second input 696 (i.e., the second clock path 682). Also, the second delay control circuit 720 generates the second delay control signal based on the third clock signal from the second clock path 682, and the second multiplexer 750 selects the second input 754 (i.e., the second delay control signal).

Before the clock switch, the control circuit 690 causes the first clock gating circuit 626 to pass the first clock signal. This allows the first clock signal to propagate through the first clock path 674 to the first delay control circuit 710. The first delay control circuit 710 locks onto the first clock signal and generates the first delay control signal based on the first clock signal. After the lock, the first delay control circuit 710 may enter the hold mode, in which the first delay control circuit 710 holds the generated first delay control signal (e.g., stores the first delay control signal in a register) and outputs the first delay control signal without continued need for the first clock signal.

After the first delay control circuit 710 is in the hold mode, the first delay control circuit 710 may send a signal to the control circuit 690 to proceed with the clock switch. In response, the control circuit 690 causes the clock gating circuits 626, 634, 658, and 666 to gate the respective clock signals. After the clock signals are gated, the control circuit 690 causes the first multiplexer 692 to select the first input 694 (i.e., switch from the second input 696 to the first input 694) to switch to the first clock path 674, and causes the second multiplexer 750 to select the first input 752 to switch to the first delay control circuit 710. After the first multiplexer 692 switches inputs, the control circuit 690 causes the first clock gating circuit 626 to pass the first clock signal from the first clock source 210. The first clock signal propagates through the first clock path 674 to the first multiplexer 692, which passes the first clock signal to the output 697. After the clock switch, the first delay control circuit 710 may exit the hold mode.

In this example, the system 602 may switch from the second clock source 220 to the third clock source 605 as follows. Initially, the second circuit 642 selects the second clock source 220, the first circuit 610 gates the first and third clock signals, and the first multiplexer 692 selects the second input 696 (i.e., the second clock path 682). Also, the second delay control circuit 720 generates the second delay control signal based on the second clock signal from the second clock path 682, and the second multiplexer 750 selects the second input 754 (i.e., the second delay control signal).

Before the clock switch, the control circuit 690 causes the second clock gating circuit 634 to pass the third clock signal. This allows the third clock signal to propagate through the first clock path 674 to the first delay control circuit 710. The first delay control circuit 710 locks onto the third clock signal and generates the first delay control signal based on the third clock signal. After the lock, the first delay control circuit 710 may enter the hold mode, in which the first delay control circuit 710 holds the generated first delay control signal (e.g., stores the first delay control signal in a register) and outputs the first delay control signal without continued need for the third clock signal.

After the first delay control circuit 710 is in the hold mode, the first delay control circuit 710 may send a signal to the control circuit 690 to proceed with the clock switch. In response, the control circuit 690 causes the clock gating circuits 626, 634, 658, and 666 to gate the respective clock signals. After the clock signals are gated, the control circuit 690 causes the first multiplexer 692 to select the first input 694 (i.e., switch from the second input 696 to the first input 694) to switch to the first clock path 674, and causes the second multiplexer 750 to select the first input 752 to switch to the first delay control circuit 710. After the first multiplexer 692 switches inputs, the control circuit 690 causes the second clock gating circuit 634 to pass the third clock signal from the third clock source 605. The third clock signal propagates through the first clock path 674 to the first multiplexer 692, which passes the third clock signal to the output 697. After the clock switch, the first delay control circuit 710 may exit the hold mode.

In this example, the system 602 may switch from the third clock source 605 to the second clock source 220 as follows. Initially, the first circuit 610 selects the third clock source 605, the second circuit 642 gates the second and third clock signals, and the first multiplexer 692 selects the first input 694 (i.e., the first clock path 674). Also, the first delay control circuit 710 generates the first delay control signal based on the third clock signal from the first clock path 674, and the second multiplexer 750 selects the first input 752 (i.e., the first delay control signal).

Before the clock switch, the control circuit 690 causes the third clock gating circuit 658 to pass the second clock signal. This allows the second clock signal to propagate through the second clock path 682 to the second delay control circuit 720. The second delay control circuit 720 locks onto the second clock signal and generates the second delay control signal based on the second clock signal. After the lock, the second delay control circuit 720 may enter the hold mode, in which the second delay control circuit 720 holds the generated second delay control signal (e.g., stores the second delay control signal in a register) and outputs the second delay control signal without continued need for the second clock signal.

After the second delay control circuit 720 is in the hold mode, the second delay control circuit 720 may send a signal to the control circuit 690 to proceed with the clock switch. In response, the control circuit 690 causes the clock gating circuits 626, 634, 658, and 666 to gate the respective clock signals. After the clock signals are gated, the control circuit 690 causes the first multiplexer 692 to select the second input 696 (i.e., switch from the first input 694 to the second input 696) to switch to the second clock path 682, and causes the second multiplexer 750 to select the second input 754 to switch to the second delay control circuit 720. After the first multiplexer 692 switches inputs, the control circuit 690 causes the third clock gating circuit 658 to pass the second clock signal from the second clock source 220. The second clock signal propagates through the second clock path 682 to the first multiplexer 692, which passes the second clock signal to the output 697. After the clock switch, the second delay control circuit 720 may exit the hold mode.

In the examples discussed above, each time the system 602 switches clock sources, the system 602 alternates between the first clock path 674 and the second clock path 682, and alternates between the first delay control circuit 710 and the second delay control circuit 720. Before a clock switch from a current clock signal (e.g., one of the first, second, and third clock signals) to a new clock source (e.g., another one of the first, second, and third clock signals), one of the delay control circuits 710 and 720 receives the current clock signal and the other one of the delay control circuits 710 and 720 receives the new clock signal. This allows the other one of the delay control circuits to lock onto the new clock signal and generate the respective delay control signal based on the new clock signal. During the switch to the new clock signal, the control circuit 690 causes the second multiplexer 750 to select the other one of the delay control circuits 710 and 720 (which outputs the respective delay control signal based on the new clock signal). By having the other one of the delay control circuit lock onto the new clock signal before the clock switch, the system 602 eliminates or reduces the impact of locking latency (e.g., DLL locking latency) on the clock switching.

Figure 8:
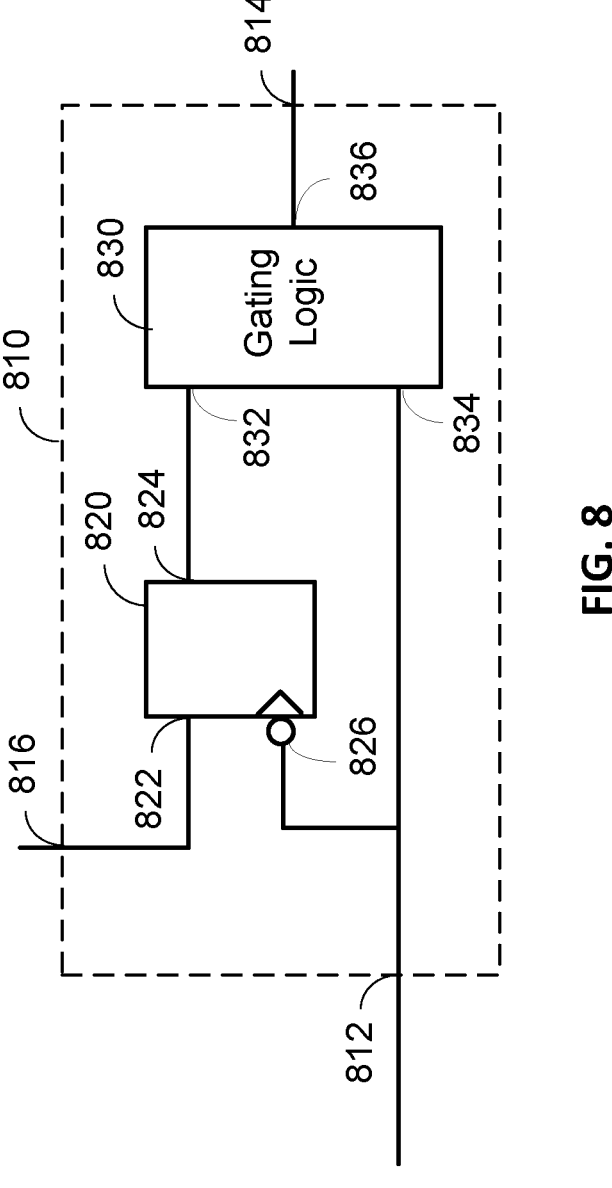
FIG. 8 shows an exemplary implementation of a clock gating circuit according to certain aspects of the present disclosure.

FIG. 8 shows an example of a clock gating circuit 810 according to certain aspects. In certain aspects, each of the clock gating circuits 320, 330, 626, 634, 658, and 666 discussed above may be implemented with a separate instance (i.e., copy) of the exemplary clock gating circuit 810. However, it is to be appreciated that the clock gating circuits 320, 330, 626, 634, 658, and 666 are not limited to the example shown in FIG. 8

The clock gating circuit 810 has an input 812 configured to receive a clock signal, a control input 816 configured to receive a control signal, and an output 814. The clock gating circuit 810 includes a latch 820 (e.g., flip flop) and gating logic 830. The latch 820 has a control input 822 coupled to the control input 816, a clock input 826 coupled to the input 812, and an output 824. The gating logic 830 has a control input 832 coupled to the output 824 of the latch 820, a clock input 834 coupled to the input 812, and an output 836 coupled to the output 814.

The latch 820 receives the control signal at the control input 822, and receives the clock signal at the clock input 826. The latch 820 is configured to latch the logic value of the control signal on a falling edge of the clock signal, and output the latched logic value of the control signal at the output 824.

The gating logic 830 receives the latched logic value of the control signal at the control input 832, and receive the clock signal at the clock input 834. The gating logic 830 is configured to gate or pass the clock signal based on the latched logic value of the control signal. For example, the gating logic 830 may be configured to pass the clock signal to the output 836 when the latched logic value of the control signal is logic one, and gate the clock signal when the latched logic value of the control signal is logic zero, or vice versa. The gating logic 830 may also be configured to output a logic zero at the output 836 when the clock signal is gated. The gating logic 830 may be implemented with one or more logic gates (e.g., one or more AND gates, one or more NAND gate, one or more NOR gate, one or more inverters, or any combination thereof). For example, the gating logic 830 may be implemented with an AND gate in which a first input of the AND gate is used for the control input 832, a second input of the AND gate is used for the clock input 834, and the output of the AND gate is used for the output 836. However, it is to be appreciated that the present disclosure is not limited to this example, and that the gating logic 830 may be implemented using various logic gates and/or various combinations of logic gates configured to perform the gating functions discussed above according to various aspects.

Because the latch 820 latches the logic value of the control signal on a falling edge of the clock signal, the latch 820 outputs a change in the control signal to the gating logic 830 when the clock signal is low. Thus, the gating logic 830 starts gating the clock signal or starts passing the clock signal in response to a change in the logic value of the control when the clock signal is low, which helps prevents generation of a glitch.

Figure 9:
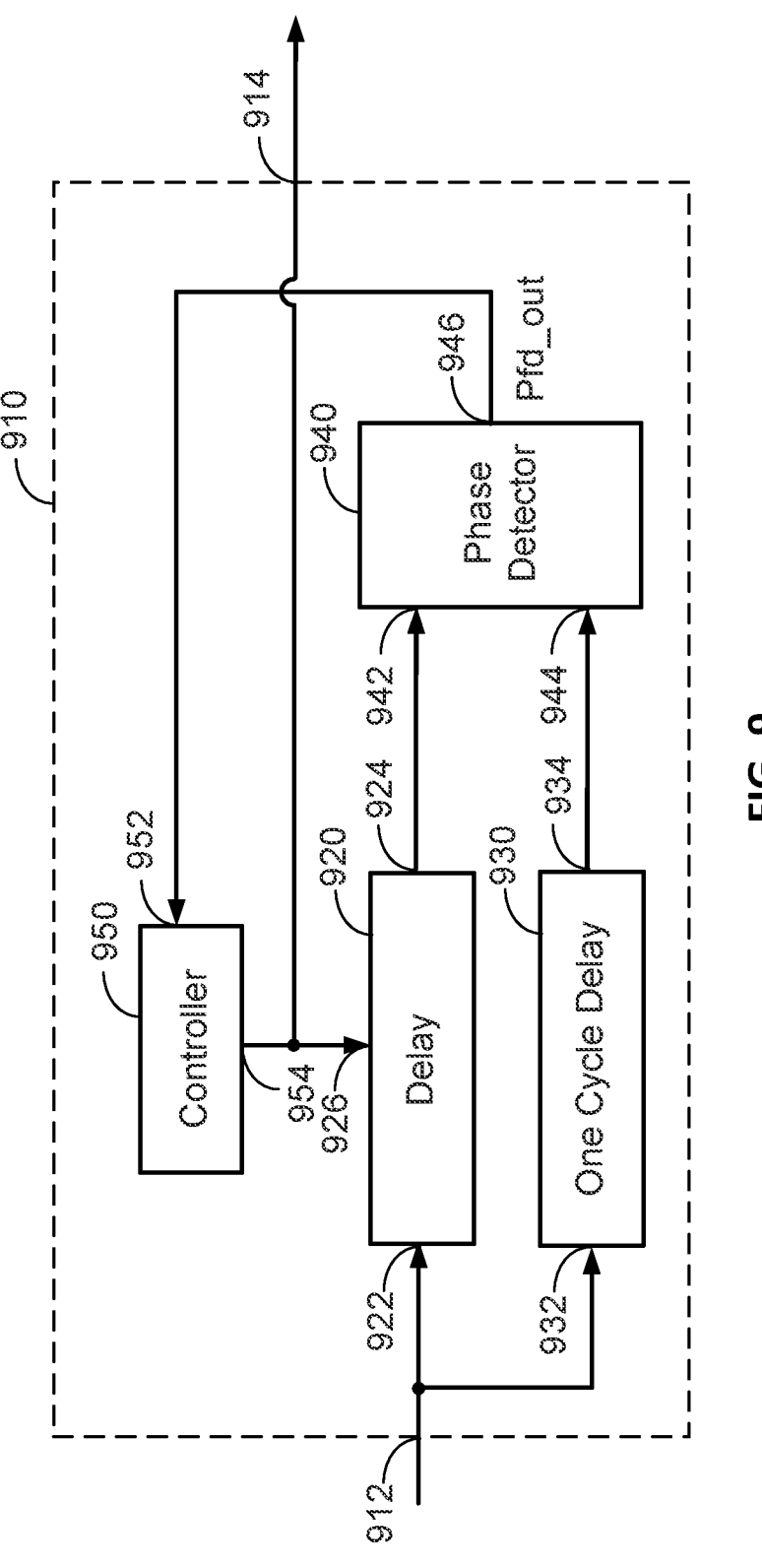
FIG. 9 shows an exemplary implementation of a delay-locked loop (DLL) according to certain aspects of the present disclosure.

FIG. 9 shows an exemplary DLL 910 according to certain aspects. Each of the DLLs 516, 715 and 725 discussed above may be implemented with a separate instance (i.e., copy) of the exemplary DLL 910. However, it is to be appreciated that the DLLs 516, 715 and 725 are not limited to this example.

In this example, the DLL 910 has an input 912 configured to receive a clock signal, and an output 914 configured to output the respective delay control signal. For the example wherein the DLL 910 implements the DLL 516, the input 912 may be coupled to the clock path 120, and the output 914 may be coupled to the control input 520 of the delay circuit 410. For the example where the DLL 910 implements the first DLL 715, the input 912 may be coupled to the first clock path 674, and the output 914 may be coupled to the first input 752 of the second multiplexer 750. For the example where the DLL 910 implements the second DLL 725, the input 912 may be coupled to the second clock path 682, and the output 914 may be coupled to the second input 754 of the second multiplexer 750.

The DLL 910 includes a delay circuit 920, a one cycle delay circuit 930, a phase detector 940 (also referred to as phase frequency detector), and a controller 950. In certain aspects, the delay circuit 920 may include delay buffers coupled in series. However, it is to be appreciated that the present disclosure is not limited to this example. The delay circuit 920 has an input 922 and an output 924. The input 922 of the delay circuit 920 is coupled to the input 912 of the DLL 910. The delay circuit 920 is configured to receive the clock signal at the input 922, delay the clock signal by a tunable delay, and output the delayed clock signal at the output 924. The delay circuit 920 also has a control input 926 configured to receive a delay control signal from the controller 950. As discussed further below, the tunable delay of the delay circuit 920 is controlled by the delay control signal from the controller 950.

The one cycle delay circuit 930 has an input 932 and an output 934. The input 932 of the one cycle delay circuit 930 is coupled to the input 912 of the DLL 910. The one cycle delay circuit 930 is configured to receive the clock signal at the input 932, delay the clock signal by one cycle (i.e., one period) of the clock signal, and output the one cycle delayed clock signal at the output 934. For example, the one cycle delay circuit 930 may include a latch (e.g., flip flop) that is clocked by the clock signal.

The phase detector 940 has a first input 942 coupled to the output 924 of the delay circuit 920, a second input 944 coupled to the output 934 of the one cycle delay circuit 930, and an output 946. The phase detector 940 is configured to compare the phases of the delayed clock signal from the delay circuit 920 and the one cycle delayed clock signal, and output an output signal (labeled "Pfd_out") indicating the phase difference (i.e., phase error) between the delayed clock signal from the delay circuit 920 and the one cycle delayed clock signal. The phase detector 940 may be implemented with a bang-bang phase detector or another type of phase detector.

The controller 950 has an input 952 coupled to the output 946 of the phase detector 940, and an output 954 coupled to the control input 926 of the delay circuit 920. The controller 950 is configured to receive the output signal from the phase detector 940 at the input 952, generate a delay control signal based on the received output signal, and output the delay control signal to the delay circuit 920 via the output 954. In certain aspects, the controller 950 is configured to tune (i.e., adjust) the delay of the delay circuit 920 using the delay control signal until the phase difference between the delayed clock signal from the delay circuit 920 and the one cycle delayed clock signal is approximately zero. When the phase difference (i.e., phase error) is approximately zero, the delay of the delay circuit 920 is approximately equal to one cycle (i.e., one period) of the clock signal. Thus, in this example, the DLL 910 locks when the delay of the delay circuit 920 is approximately equal to one cycle (i.e., one period) of the clock signal.

The delay control signal generated by the controller 950 may also be output to the output 914 to provide the delay control signal of the DLL 910. In some implementations, the delay circuit 920 includes n number of delay buffers (not shown) coupled in series, and the delay circuit 410 includes m number of delay buffers (not shown) coupled in series. In this example, when the DLL 910 is locked, the delay of each of the delay buffers in the delay circuit 920 is approximately equal to 1/n of one cycle of the clock signal input to the DLL 910 where n is the number of delay buffers in the delay circuit 920. Thus, the delay control signal sets the delay of each delay buffer to 1/n of one cycle of the clock signal. In this example, the delay control signal may set the delay of the delay circuit 410 to be approximately equal to m/n of one cycle of the clock signal where m is the number of delay buffers in the delay circuit 410. Therefore, in this example, the delay of the delay circuit 410 may be set to a desired fraction of one cycle of the clock signal by setting the ratio of n and m accordingly. However, it is to be appreciated that the present disclosure is not limited to this example.

In certain aspects, the controller 950 may enter a hold mode when the DLL 910 locks onto the clock signal. For example, the controller 950 may determine the DLL 910 is locked when the phase difference (i.e., phase error) from the phase detector 940 is approximately equal to zero. Thus, in this example, the DLL 910 locks when the delay of the delay circuit 920 is approximately equal to one cycle (i.e., one period) of the clock signal. In the hold mode, the controller

950 holds the delay control signal (e.g., stores the delay control signal in a register) and outputs the delay control signal without continued need for the clock signal. In certain aspects, the controller 950 may send a signal to the control circuit 690 indicating that the DLL 910 has entered the hold mode (e.g., a signal to proceed with a clock switch). In response to the signal, the control circuit 690 may cause the clock gating circuits 626, 634, 658, and 666 to gate the respective clock signal in preparation for causing the first multiplexer 692 to switch inputs, as discussed above. After the first multiplexer 692 switches inputs, the control circuit 690 may send a signal to the controller 950 to exit the hold mode. In response to the signal, the DLL 910 exits the hold mode, and resumes using the clock signal to generate the delay clock signal.

Figure 10:
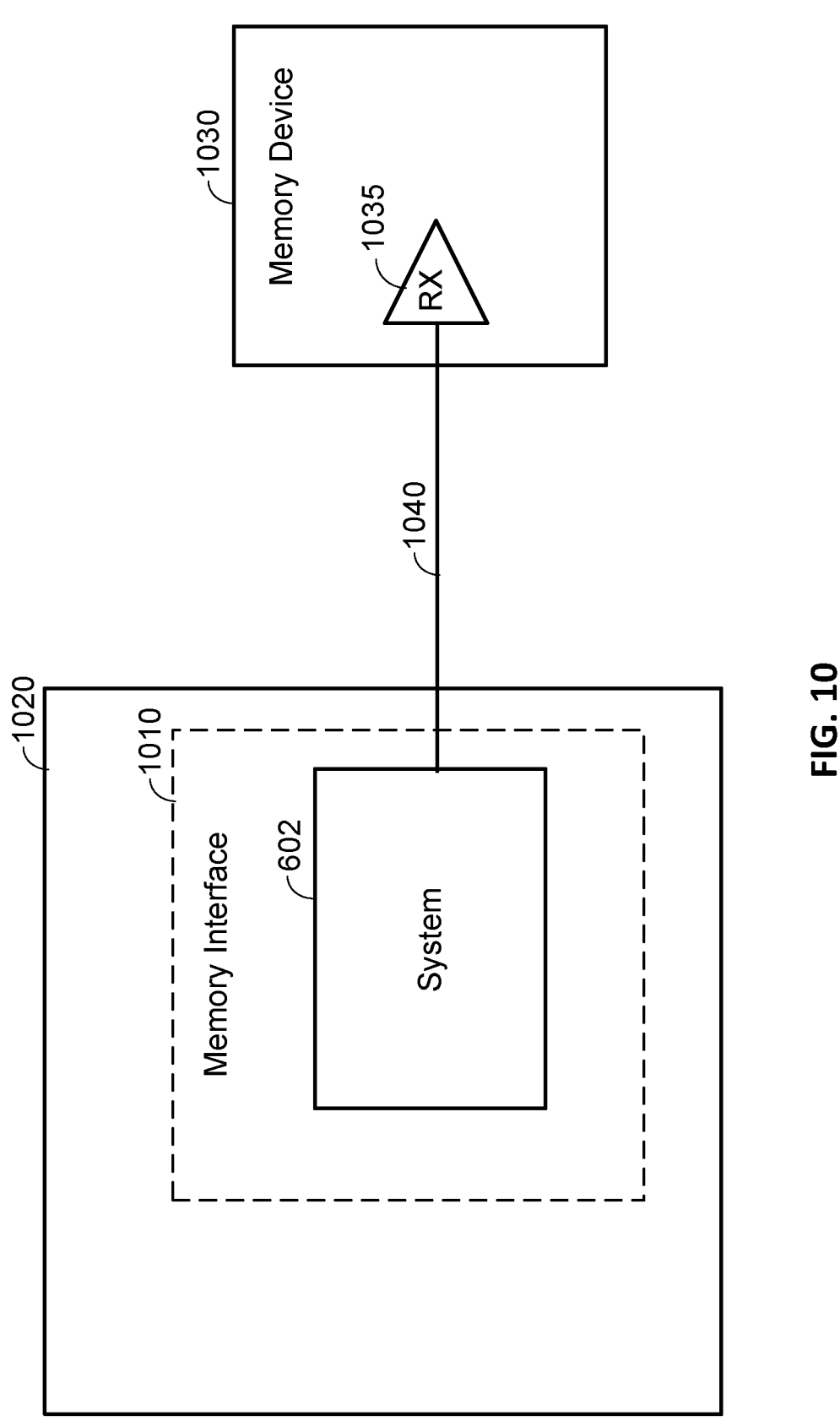
FIG. 10 shows an example of a memory interface according to certain aspects of the present disclosure.

In certain aspects, the system 602 may be used in a memory interface. In this regard, FIG. 10 shows an example of a memory interface 1010 including the system 602 according to certain aspects. For ease of illustration, details of the system 602 are not shown in FIG. 11. It is to be appreciated that the system 602 in the memory interface 1010 may include some or all of the components shown in the examples in FIGS. 6 and 7.

In this example, the memory interface 1010 may be integrated on a chip 1020, and may be coupled to a memory device 1030 (e.g., a double-data rate (DDR) dynamic random-access memory (DRAM), a low power DDR (LPDDR) DRAM, etc.) via one or more links. The memory interface 1010 may be used to interface one or more processors (not shown) on the chip 1020 to the memory device 1030.

In the example shown in FIG. 10, the memory device 1030 includes a receiver 1035, which may be coupled to the output 424 of the clock transmitter 420 (shown in FIG. 7) via a link 1040. The receiver 1035 may be configured to receive the selected clock signal from the clock transmitter 420 to time data sampling in the memory device 1030 and/or time other operations in the memory device 1030. In this example, the memory interface 1010 may also include the data circuit 430 and the data transmitter 440 (shown in FIG. 4) for sending data to the memory device 1030 via one or more links. The memory device 1030 may also include one or more arrays of memory cells (not shown) for storing data, read/write circuitry (not shown), etc.

FIG. 11 illustrates a method 1100 for clock switching using an OR gate having a first input and a second input according to certain aspects of the present disclosure.

At block 1110, in a first mode, a logic zero is input to the second input of the OR gate. For example, the logic zero may be input to the second input of the OR gate by the second clock gating circuit 330 or the second clock gating circuit 634.

At block 1120, in the first mode, a first clock signal is passed to the first input of the OR gate. For example, the OR gate may correspond to the OR gate 340 or the first OR gate 618. The first clock signal may be passed by the first clock gating circuit 320 or the first clock gating circuit 626. The first clock signal may come from the first clock source 210.

At block 1130, the first clock signal propagates from an output of the OR gate through a clock path. The clock path may correspond to the clock path 120 or the first clock path 674.

At block 1140, in a second mode, a logic zero is input to the first input of the OR gate. For example, the logic zero may be input to the first input of the OR gate by the first clock gating circuit 320 or the first clock gating circuit 626.

At block 1150, in the second mode, a second clock signal is passed to the second input of the OR gate. For example, the second clock signal may be passed to the second input of the OR gate by the second clock gating circuit 330 or the second clock gating circuit 634. The second clock signal may correspond to the second clock signal from the second clock source 220 for the example where the OR gate corresponds to the OR gate 340, and the second clock signal may correspond to the third clock signal from the third clock source 605 for the example where the OR gate correspond to the first OR gate 618.

At block 1160, in the second mode, the second clock signal propagates from the output of the OR gate through the clock path. The clock path may correspond to the clock path 120 or the first clock path 674.

In certain aspects, inputting the logic zero to the first input of the OR gate includes gating the first clock signal using a first clock gating circuit coupled to the first input of the OR gate, and inputting the logic zero to the second input of the OR gate includes gating the second clock signal using a second clock gating circuit coupled to the second input of the OR gate. The first clock gating circuit may correspond to the first clock gating circuit 320 or the first clock gating circuit 626. The second clock gating circuit may correspond to the second clock gating circuit 330 or the second clock gating circuit 634.

In certain aspects, passing the first clock signal to the first input of the OR gate includes passing the first clock signal through the first clock gating circuit, and passing the second clock signal to the second input of the OR gate includes passing the second clock signal through the second clock gating circuit.

The control circuit 350 and the control circuit 690 may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
   a first clock source configured to generate a first clock signal;
   a second clock source configured to generate a second clock signal;
   a clock path;
   an OR gate having a first input, a second input, and an output, wherein the output of the OR gate is coupled to the clock path;
   a first clock gating circuit coupled between the first clock source and the first input of the OR gate; and
   a second clock gating circuit coupled between the second clock source and the second input of the OR gate.
2. The system of clause 1, wherein the clock path includes clock buffers.
3. The system of clause 1 or 2, wherein the first clock signal and the second clock signal have different frequencies.
4. The system of any one of clauses 1 to 3, further comprising a clock transmitter, wherein the clock path is coupled between the output of the OR gate and the clock transmitter.

5. The system of clause 4, further comprising a memory device coupled to the clock transmitter.

6. The system of any one of clauses 1 to 5, further comprising a delay circuit, wherein the clock path is coupled between the output of the OR gate and the delay circuit.

7. The system of clause 6, further comprising a delay control circuit coupled to the clock path and the delay circuit, wherein the delay control circuit is configured to:

receive one of the first clock signal and the second clock signal from the clock path; and set a delay of the delay circuit to a fraction of a cycle of the one of the first clock signal and the second clock signal.

8. The system of clause 7, wherein the delay control circuit comprises a delay-locked loop.

9. The system of any one of clauses 1 to 8, further comprising a control circuit configured to:

in a first mode, cause the first clock gating circuit to pass the first clock signal, and cause the second clock gating circuit to gate the second clock signal; and in a second mode, cause the first clock gating circuit to gate the first clock signal, and cause the second clock gating circuit to pass the second clock signal.

10. A system, comprising:

a first OR gate having a first input, a second input, and an output, a first clock gating circuit coupled to the first input of the first OR gate;

a second clock gating circuit coupled to the second input of the OR gate;

a second OR gate having a first input, a second input, and an output, a third clock gating circuit coupled to the first input of the second OR gate;

a fourth clock gating circuit coupled to the second input of the second OR gate;

a multiplexer having a first input, a second input, and an output;

a first clock path coupled between the output of the first OR gate and the first input of the multiplexer; and a second clock path coupled between the output of the second OR gate and the second input of the multiplexer.

11. The system of clause 10, wherein:

the first clock path comprises first clock buffers; and the second clock path comprises second clock buffers.

12. The system of clause 10 or 11, further comprising a clock transmitter coupled to the output of the multiplexer.

13. The system of clause 12, further comprising a memory device coupled to the clock transmitter.

14. The system of clause 13, wherein the memory device includes a double data rate (DDR) memory.

15. The system of any one of clauses 12 to 14, further comprising a delay circuit coupled between the output of the multiplexer and the clock transmitter.

16. The system of any one of clauses 10 to 15, further comprising:

a first clock source configured to generate a first clock signal, wherein the first clock gating circuit is coupled between the first clock source and the first input of the first OR gate;

a second clock source configured to generate a second clock signal, wherein the third clock gating circuit is coupled between the second clock source and the first input of the second OR gate; and a third clock source configured to generate a third clock signal, wherein the second clock gating circuit is coupled between the third clock source and the second input of the first OR gate, and the fourth clock gating circuit is coupled between the third clock source and the second input of the second OR gate.

17. The system of clause 16, wherein the first clock signal, the second clock signal, and the third clock signal have different frequencies.

18. The system of clause 16 or 17, further comprising a control circuit configured to:

in a first mode, cause the first clock gating circuit to pass the first clock signal, cause the second clock gating circuit to gate the third clock signal, cause the third clock gating circuit to gate the second clock signal, cause the fourth clock gating circuit to gate the third clock signal, and cause the multiplexer to select the first input of the multiplexer.

19. The system of clause 18, wherein the control circuit is configured to:

in a second mode, cause the first clock gating circuit to gate the first clock signal, cause the second clock gating circuit to gate the third clock signal, cause the third clock gating circuit to pass the second clock signal, cause the fourth clock gating circuit to gate the third clock signal, and cause the multiplexer to select the second input of the multiplexer.

20. The system of clause 19, wherein the control circuit is configured to:

in a third mode, cause the first clock gating circuit to gate the first clock signal, cause the second clock gating circuit to pass the third clock signal, cause the third clock gating circuit to gate the second clock signal, cause the fourth clock gating circuit to gate the third clock signal, and cause the multiplexer to select the first input of the multiplexer.

21. The system of clause 20, wherein the control circuit is configured to:

in a fourth mode, cause the first clock gating circuit to gate the first clock signal, cause the second clock gating circuit to gate the third clock signal, cause the third clock gating circuit to gate the second clock signal, cause the fourth clock gating circuit to pass the third clock signal, and cause the multiplexer to select the second input of the multiplexer.

22. A method for clock switching using an OR gate having a first input and a second input, comprising:

in a first mode, inputting a logic zero to the second input of the OR gate;

passing a first clock signal to the first input of the OR gate; and propagating the first clock signal from an output of the OR gate through a clock path; and in a second mode, inputting a logic zero to the first input of the OR gate;

passing a second clock signal to the second input of the OR gate; and propagating the second clock signal from the output of the OR gate through the clock path.

23. The method of clause 22, wherein the first clock signal and the second clock signal have different frequencies.

24. The method of clause 22 or 23, wherein the clock path is coupled between the output of the OR gate and a clock transmitter.

25. The method of any one of clauses 22 to 24, wherein:
inputting the logic zero to the first input of the OR gate comprises gating the first clock signal using a first clock gating circuit coupled to the first input of the OR gate; and
inputting the logic zero to the second input of the OR gate comprises gating the second clock signal using a second clock gating circuit coupled to the second input of the OR gate.

26. The method of clause 25, wherein:
passing the first clock signal to the first input of the OR gate comprises passing the first clock signal through the first clock gating circuit; and
passing the second clock signal to the second input of the OR gate comprises passing the second clock signal through the second clock gating circuit.

It is to be appreciated that the present disclosure is not limited to the exemplary terminology used above to describe aspects of the present disclosure. For example, a delay circuit including delay buffers coupled in series may also be referred to as a delay line. A delay buffer may also be referred to as a delay stage, a delay element, a delay unit, a delay cell, or another term. A control circuit may also be referred to a controller, control logic, or another term. A phase detector may also be referred to as a phase frequency detector, a phase comparator, or another term. A clock buffer may also be referred to as a clock driver, or another term.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, the term "approximately" means within 10 percent of the stated value (i.e., within 90 percent to 110 percent of stated value).

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a first clock source configured to generate a first clock signal;
a second clock source configured to generate a second clock signal;

a third clock source configured to generate a third clock signal;
a first OR gate having a first input, a second input, and an output;
a first clock gating circuit coupled between the first clock source and the first input of the first OR gate;
a second clock gating circuit coupled between the third clock source and the second input of the first OR gate;
a second OR gate having a first input, a second input, and an output;
a third clock gating circuit coupled between the second clock source and the first input of the second OR gate;
a fourth clock gating circuit coupled between the third clock source and the second input of the second OR gate;
a multiplexer having a first input, a second input, and an output;
a first clock path coupled between the output of the first OR gate and the first input of the multiplexer; and
a second clock path coupled between the output of the second OR gate and the second input of the multiplexer.

2. The system of claim 1, wherein:
the first clock path comprises first clock buffers; and
the second clock path comprises second clock buffers.

3. The system of claim 1, further comprising a clock transmitter coupled to the output of the multiplexer.

4. The system of claim 3, further comprising a memory device coupled to the clock transmitter.

5. The system of claim 4, wherein the memory device includes a double data rate (DDR) memory.

6. The system of claim 3, further comprising a delay circuit coupled between the output of the multiplexer and the clock transmitter.

7. The system of claim 1, wherein the first clock signal, the second clock signal, and the third clock signal have different frequencies.

8. The system of claim 1, further comprising a control circuit configured to:
in a first mode, cause the first clock gating circuit to pass the first clock signal, cause the second clock gating circuit to gate the third clock signal, cause the third clock gating circuit to gate the second clock signal, cause the fourth clock gating circuit to gate the third clock signal, and cause the multiplexer to select the first input of the multiplexer.

9. The system of claim 8, wherein the control circuit is configured to:
in a second mode, cause the first clock gating circuit to gate the first clock signal, cause the second clock gating circuit to gate the third clock signal, cause the third clock gating circuit to pass the second clock signal, cause the fourth clock gating circuit to gate the third clock signal, and cause the multiplexer to select the second input of the multiplexer.

10. The system of claim 9, wherein the control circuit is configured to:
in a third mode, cause the first clock gating circuit to gate the first clock signal, cause the second clock gating circuit to pass the third clock signal, cause the third clock gating circuit to gate the second clock signal, cause the fourth clock gating circuit to gate the third clock signal, and cause the multiplexer to select the first input of the multiplexer.

11. The system of claim 10, wherein the control circuit is configured to:
in a fourth mode, cause the first clock gating circuit to gate the first clock signal, cause the second clock gating circuit to gate the third clock signal, cause the third clock gating circuit to gate the second clock signal, cause the fourth clock gating circuit to pass the third clock signal, and cause the multiplexer to select the second input of the multiplexer.

12. A system, comprising:

a first OR gate having a first input, a second input, and an output;

a first clock gating circuit coupled the first input of the first OR gate;

a second clock gating circuit coupled to the second input of the first OR gate;

a second OR gate having a first input, a second input, and an output;

a third clock gating circuit coupled to the first input of the second OR gate;

a fourth clock gating circuit coupled to the second input of the second OR gate;

a first multiplexer having a first input, a second input, and an output;

a first clock path coupled between the output of the first OR gate and the first input of the first multiplexer;

a second clock path coupled between the output of the second OR gate and the second input of the first multiplexer;

a delay circuit coupled to the output of the first multiplexer;

a second multiplexer having a first input, a second input, and an output, wherein the output of the second multiplexer is coupled to a control input of the delay circuit;

a first delay control circuit coupled between the first clock path and the first input of the second multiplexer; and a second delay control circuit coupled between the second clock path and the second input of the second multiplexer.

13. The system of claim 12, wherein the first delay control circuit comprises a first a delay-locked loop, and the second delay control circuit comprises a second delay-looked loop.

14. The system of claim 12, further comprising:

a first clock source configured to generate a first clock signal, wherein the first clock gating circuit is coupled between the first clock source and the first input of the first OR gate;

a second clock source configured to generate a second clock signal, wherein the third clock gating circuit is coupled between the second clock source and the first input of the second OR gate; and a third clock source configured to generate a third clock signal, wherein the second clock gating circuit is coupled between the third clock source and the second input of the first OR gate, and the fourth clock gating circuit is coupled between the third clock source and the second input of the second OR gate.

15. The system of claim 14, wherein the first clock signal, the second clock signal, and the third clock signal have different frequencies.

16. The system of claim 14, wherein the first clock source comprises a first phase-locked loop, and the second clock source comprises a second phase-locked loop.

17. The system of claim 12, further comprising a clock transmitter, wherein the delay circuit is coupled between the output of the first multiplexer and the clock transmitter.

18. The system of claim 17, further comprising a memory device coupled to the clock transmitter.

* * * * *